(12) United States Patent
LiCausi et al.

(10) Patent No.: US 11,158,574 B2
(45) Date of Patent: Oct. 26, 2021

(54) METHODS OF FORMING A CONDUCTIVE CONTACT STRUCTURE TO AN EMBEDDED MEMORY DEVICE ON AN IC PRODUCT AND A CORRESPONDING IC PRODUCT

(71) Applicant: GLOBALFOUNDRIES U.S. Inc., Santa Clara, CA (US)

(72) Inventors: Nicholas LiCausi, Watervliet, NY (US); Julien Frougier, Albany, NY (US); Keith Donegan, Saratoga Springs, NY (US); Hyung Woo Kim, Watervliet, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/726,497

(22) Filed: Dec. 24, 2019

(65) Prior Publication Data

US 2021/0193573 A1  Jun. 24, 2021

(51) Int. Cl.
*H01L 23/528* (2006.01)
*H01L 45/00* (2006.01)
(Continued)

(52) U.S. Cl.
CPC ...... *H01L 23/5283* (2013.01); *H01L 23/5226* (2013.01); *H01L 23/53228* (2013.01); *H01L 23/53257* (2013.01); *H01L 23/53295* (2013.01); *H01L 27/1159* (2013.01); *H01L 27/11587* (2013.01); *H01L 27/222* (2013.01); *H01L 27/24* (2013.01); *H01L 43/02* (2013.01);
(Continued)

(58) Field of Classification Search
CPC ............. H01L 23/5283; H01L 23/5226; H01L 23/53228; H01L 23/53257; H01L 23/53295; H01L 27/11587; H01L 27/1159; H01L 27/222; H01L 27/24; H01L 43/02; H01L 43/08; H01L 43/12; H01L 45/06; H01L 45/1233; H01L 45/16
USPC .......................................................... 257/2
See application file for complete search history.

(56) References Cited

U.S. PATENT DOCUMENTS 6,326,270 B1  12/2001 Lee et al.
6,780,763 B2  8/2004 Lee
(Continued)

OTHER PUBLICATIONS

U.S. Appl. No. 16/726,447, Office Action dated Apr. 26, 2021, 11 pages.

*Primary Examiner* — Tu-Tu V Ho
(74) *Attorney, Agent, or Firm* — Hoffman Warnick LLC

(57) ABSTRACT

One illustrative device disclosed herein includes a layer of insulating material with its upper surface positioned at a first level and a recessed conductive interconnect structure positioned at least partially within the layer of insulating material, wherein a recessed upper surface of the recessed conductive interconnect structure is positioned at a second level that is below the first level. In this example, the device also includes a conductive cap layer positioned on the recessed upper surface of the recessed conductive interconnect structure, wherein an upper surface of the conductive cap layer is substantially co-planar with the upper surface of the layer of insulating material and a memory cell positioned above the conductive cap layer, wherein the memory cell comprises a lower conductive material that is conductively coupled to the conductive cap layer.

20 Claims, 22 Drawing Sheets

(51) Int. Cl.
| | |
|---|---|
| *H01L 23/532* | (2006.01) |
| *H01L 27/24* | (2006.01) |
| *H01L 27/22* | (2006.01) |
| *H01L 27/11587* | (2017.01) |
| *H01L 27/1159* | (2017.01) |
| *H01L 43/02* | (2006.01) |
| *H01L 43/08* | (2006.01) |
| *H01L 43/12* | (2006.01) |
| *H01L 23/522* | (2006.01) |

(52) U.S. Cl.
CPC .............. *H01L 43/08* (2013.01); *H01L 43/12* (2013.01); *H01L 45/06* (2013.01); *H01L 45/1233* (2013.01); *H01L 45/16* (2013.01)

(56) References Cited

U.S. PATENT DOCUMENTS

| | | |
|---|---|---|
| 9,842,986 B2 | 12/2017 | Chuang et al. |
| 9,917,129 B2 | 3/2018 | Yokoyama et al. |
| 10,109,790 B2 | 10/2018 | Chuang et al. |
| 10,566,519 B2 | 2/2020 | Chen et al. |
| 2004/0175924 A1 | 9/2004 | Choi et al. |
| 2006/0145243 A1 | 7/2006 | Wong et al. |
| 2011/0291183 A1 | 12/2011 | Lin et al. |
| 2014/0264902 A1 | 9/2014 | Ting et al. |
| 2017/0062712 A1* | 3/2017 | Choi ...................... H01L 43/08 |
| 2019/0013354 A1 | 1/2019 | Lee et al. |
| 2019/0027537 A1 | 1/2019 | Wiegand et al. |
| 2019/0043795 A1 | 2/2019 | Chen et al. |
| 2019/0081102 A1* | 3/2019 | Park ................... H01L 21/7685 |
| 2020/0111736 A1 | 4/2020 | Amanapu et al. |

\* cited by examiner

METHODS OF FORMING A CONDUCTIVE CONTACT STRUCTURE TO AN EMBEDDED MEMORY DEVICE ON AN IC PRODUCT AND A CORRESPONDING IC PRODUCT

BACKGROUND OF THE INVENTION

Field of the Invention

The present disclosure generally relates to the fabrication of integrated circuits, and, more particularly, to various novel methods of forming conductive contact structures to an embedded memory device on an integrated circuit (IC) product and a corresponding IC product.

Description of the Related Art

In many modern integrated circuit products, embedded memory devices and logic circuits (e.g., microprocessors) are formed on the same substrate or chip. Such embedded memory devices may come in a variety of forms, e.g., an MTJ (magnetic tunnel junction) memory device, an RRAM (resistive random access memory) device, a PRAM (phase-change random access memory) device, an STT-MRAM (spin transfer torque magnetic random access memory) device, a FRAM (ferroelectric random access memory) device, etc. Typically, all of the embedded memory devices have some form of conductive material at the upper and lower surfaces of the memory cell that permits electrical connection to the memory cell. In some cases, the conductive material may take the form of an electrode structure that simply serves as a means of allowing electrical connection to the memory cell. In other cases, the conductive material may be a functioning part of the memory cell itself. In any event, various conductive structures must be formed to establish electrical connection to the memory cell for the memory cell to operate.

Problems have arisen with respect to the embedding of memory cells on chips that also include logic devices. For example, the physical height of conductive vias in the logic area can be relatively large, and significantly different than the physical height of some memory cells. As a result, incorporating both memory cells and logic devices on a single substrate can lead to some modification of some of the metallization layers formed above such a substrate. For example, co-integration of both memory cells and logic devices may require the formation of layers of the insulation material(s) in which the memory cells are positioned to a greater thickness than would be required if the memory cells were not present. However, forming this relatively thicker layer of insulating material in the logic regions of an IC product can lead to other problems. For example, forming such relatively thicker insulating material(s) in the logic region can have the effect of increasing the vertical height of the conductive vias formed in the logic region. As a result, the via openings formed in the thicker insulating material(s) have a higher aspect ratio and may be more difficult to properly fill. Accordingly, more defective conductive vias may be formed which can reduce product yields and/or reduce device performance capabilities.

The present disclosure is generally directed to various novel methods of forming conductive contact structures to an embedded memory device on an integrated circuit (IC) product and a corresponding IC product that may at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming conductive contact structures to an embedded memory device on IC product and an IC product having such a novel corresponding configuration. One illustrative device disclosed herein includes a layer of insulating material with its upper surface positioned at a first level and a recessed conductive interconnect structure positioned at least partially within the layer of insulating material, wherein a recessed upper surface of the recessed conductive interconnect structure is positioned at a second level that is below the first level. In this example, the device also includes a conductive cap layer positioned on the recessed upper surface of the recessed conductive interconnect structure, wherein an upper surface of the conductive cap layer is substantially co-planar with the upper surface of the layer of insulating material and a memory cell positioned above the conductive cap layer, wherein the memory cell comprises a lower conductive material that is conductively coupled to the conductive cap layer.

One illustrative integrated circuit product disclosed herein includes a memory region, a logic region and a metallization layer positioned above the memory region and the logic region, wherein the metallization layer comprises a first layer of insulating material having an upper surface positioned at a first level. In this illustrative example, the integrated circuit product also includes a plurality of recessed conductive interconnect structures positioned at least partially within the first layer of insulating material, wherein a first group of the plurality of recessed conductive interconnect structures is positioned in the memory region and a second group of the plurality of recessed conductive interconnect structures is positioned in the logic region, each of the first and second groups of recessed conductive interconnect structures comprising a recessed upper surface that is positioned at a second level that is below the first level. The device also includes a conductive cap layer positioned on the recessed upper surface of each of the first and second groups of recessed conductive interconnect structures, wherein an upper surface of the conductive cap layer is substantially co-planar with the upper surface of the first layer of insulating material and an array of memory cells positioned in the memory region, each of the memory cells being positioned above a conductive cap layer, wherein each of the memory cells comprises a lower conductive material that is conductively coupled to the conductive cap layer.

One illustrative method disclosed herein includes forming a conductive interconnect structure in at least one layer of insulating material, wherein the at least one layer of insulating material has an upper surface positioned at a first level, and performing a recess etching process to remove a portion of the conductive interconnect structure so as to define a recessed conductive interconnect structure, wherein the recessed conductive interconnect structure comprises a recessed upper surface that is positioned at a second level that is below the first level. In this example, the method further includes forming a conductive cap layer on the recessed upper surface of the recessed conductive interconnect structure, wherein an upper surface of the conductive cap layer is substantially co-planar with the upper surface of the layer of insulating material, and forming a memory cell above the conductive cap layer, wherein the memory cell comprises a lower conductive material, wherein the conductive cap layer is conductively coupled to the lower conductive material of the memory cell.

BRIEF DESCRIPTION OF THE DRAWINGS

The disclosure may be understood by reference to the following description taken in conjunction with the accompanying drawings, in which like reference numerals identify like elements, and in which.

Figure 1:
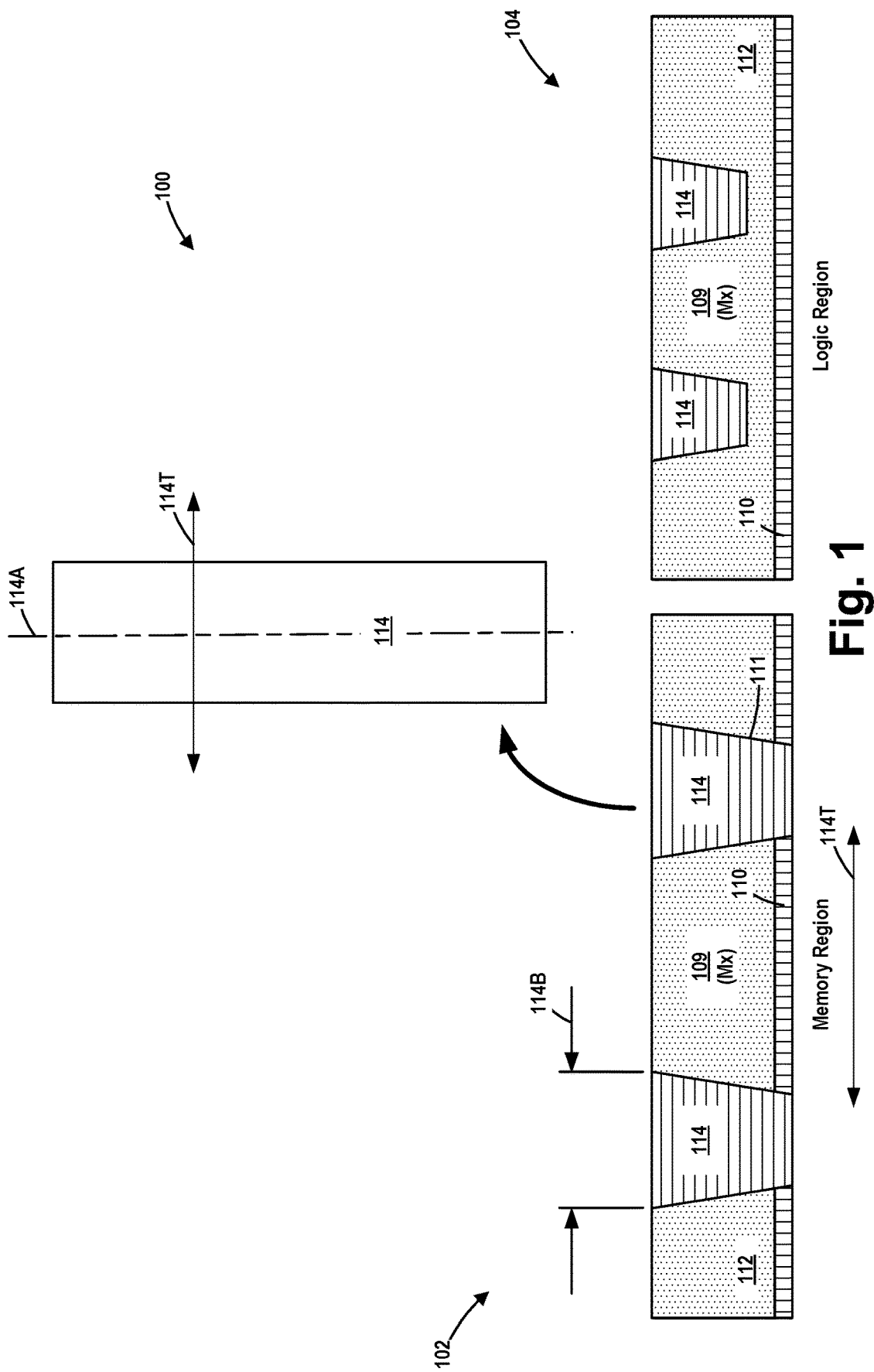
FIGS. 1-13 depict various novel methods of forming conductive contact structures to an embedded memory device on IC product and an IC product having such a novel corresponding configuration.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed methods and devices may be applicable to a variety of products, including, but not limited to, logic products, memory products, etc. With reference to the attached figures, various illustrative embodiments of the methods and devices disclosed herein will now be described in more detail.

FIGS. 1-13 depict various novel methods of forming conductive contact structures to an embedded memory device on IC product 100 and an IC product having such a novel corresponding configuration. The IC product 100 will be formed on and above a semiconductor substrate (not shown). The semiconductor substrate may have a variety of configurations, such as a bulk silicon configuration. The substrate may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate may be made of silicon or it may be made of materials other than silicon. Thus, the terms "substrate" or "semiconductor substrate" should be understood to cover all semiconducting materials and all forms of such materials. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application.

In general, and with reference to FIG. 1, the IC product 100 comprises a memory region 102 where one or more memory devices will be formed and a logic region 104 where one or more logic circuits (e.g., microprocessor circuits) will be formed in and above the semiconductor substrate (not shown in the attached figures). As is typical, the IC product 100 includes a plurality of metallization layers that constitute the overall wiring pattern for the IC product 100. These metallization layers may be formed on the IC product 100 by performing traditional manufacturing processes. These metallization layers are typically comprised of layers of insulating material(s) (e.g., silicon dioxide, silicon nitride, SiCOH, etc.) with a plurality of conductive metal lines and conductive vias formed in the layers of insulating materials. The conductive metal lines are routed across the substrate in various patterns and arrangements and provide the means for intra-layer electrical communication between the devices and structures formed on or above the substrate. The conductive vias provide the means for allowing electrical communication between the conductive metal lines in adjacent metallization layers. The first metallization layer of an IC product is typically referred to as the "M1" layer (or in some cases the "M0" layer), while the conductive vias that are used to establish electrical connection between the M1 layer and the conductive lines in the immediately adjacent upper metallization layer (the "M2 layer) are typically referred to as "V1" vias. Device level contacts (not shown) are formed above the substrate so as to provide electrical communication between the various devices, e.g., transistors, resistors, etc., that are formed on or immediately adjacent the semiconductor substrate.

FIG. 1 depicts the IC product 100 after several process operations were performed. More specifically, FIG. 1 depicts the product 100 at a point in time wherein an illustrative (and representative) metallization layer 109—$M_x$—of the IC product 100 has been formed above the semiconductor substrate (not shown). As will be appreciated by those skilled in the art after a complete reading of the present application, the metallization layer 109 is intended to be representative of any metallization layer that may be formed at any level on the IC product irrespective of its location relative to an upper surface of the semiconductor substrate or any of the other metallization layers formed on the IC product 100.

The illustrative metallization layer 109 comprises an etch-stop layer 110, a layer of insulating material 112 and a plurality of conductive interconnect structures 114 formed in or that extend through the layer of insulating material 112 and the etch-stop layer 110. The metallization layer 109 was formed in both the memory region 102 and the logic region 104. In one illustrative example, the conductive interconnect structures 114 may take the form of a conductive line-type structure having a substantially rectangular configuration when viewed from above. In other situations, the conductive interconnect structures 114 may take the form of a conductive via having a generally rectangular or oval configuration when viewed from above. In even other embodiments, the conductive interconnect structures 114 may comprise a unitary structure that comprises a line-type structure portion and a via-type structure portion.

FIG. 1 also includes a simplistic plan (top) view of one of the conductive interconnect structures 114 where the conductive interconnect structures 114 are line-type structures. In this illustrative example, the conductive interconnect structures 114 have a long axis 114A that runs perpendicular to the plane of the drawing page in FIG. 1. Also indicated in FIG. 1 is a direction 114T that is transverse or normal to the long axis 114A. In some cases, the conductive interconnect structures 114 in both the memory region 102 and the logic region 104 may have the same overall configuration (when viewed from above). In other situations, the conductive interconnect structures 114 in the memory region 102 and the logic region 104 may have a different overall configuration (when viewed from above). For example, in the case where the conductive interconnect structures 114 comprise a line-type portion, the conductive interconnect structures 114 may have a different axial length 114A (in the direction that extends into and out of the plane of the drawing page in FIG. 1) and/or a different lateral width 114B in the direction 114T. In one particularly illustrative example where the conductive interconnect structures 114 in both the memory region 102 and the logic region 104 comprise conductive line-type structures, the axial length of the conductive interconnect structures 114 in the memory region 102 may be less than the axial length of the conductive interconnect structures 114 in the logic region 102. In the case where the conductive interconnect structures 114 are via structures (e.g., a rounded or oval structure when viewed from above), the lateral width 114B of the conductive interconnect structures 114 may be measured in a direction that is either parallel or perpendicular to the long axis of the gates of the driver transistors integrated in the FEOL (Front-End of the Line). Thus, the particular size or configuration of the conductive interconnect structures 114 should not be considered a limitation to any of the inventions disclosed herein.

The insulating material 112 may be comprised of a variety of different insulating materials, e.g., silicon dioxide, SiCOH, etc. The number, size, shape, configuration and overall routing of the conductive interconnect structures 114 may vary depending upon the particular application. The conductive interconnect structures 114 may be comprised of any of a variety of different conductive materials, e.g., copper, aluminum, tungsten, etc., and they may be formed by traditional manufacturing techniques, e.g., by performing a damascene process for cases where the conductive interconnect structures 114 are made of copper and perhaps by performing traditional deposition and etching processes when the conductive interconnect structures 114 are made of a conductive material that may readily be patterned using traditional masking and patterning (e.g., etching) techniques.

The etch-stop layer 110 may be comprised of a variety of different materials, e.g., silicon nitride, carbon-doped nitride (NDC), NBLK, advanced etch stop layers like AlN/ODC, etc. The thickness of the etch-stop layer 110 may vary depending upon the particular application. The layer of insulating material 112 may be comprised of a variety of different insulating materials, e.g., silicon dioxide, TEOS, ultra low-k materials, OMCTS, densified ULK, etc., and its vertical thickness may vary depending upon the particular application. Openings 111 may be formed by performing one or more etching processes through a patterned etch mask (not shown). Then, the conductive interconnect structures 114 were formed in the openings 111 using traditional manufacturing processing techniques, e.g., by performing a deposition process so as to overfill the openings 111 with conductive material(s), followed by performing a chemical mechanical planarization (CMP) process operation to remove the excess amounts of the conductive material for the conductive interconnect structures 114 that are positioned on or above the upper surface of the layer of insulating material 112. The vertical thickness of the illustrative conductive interconnect structures 114 may vary depending upon the particular application. Of course, as will be appreciated by those skilled in the art after a complete reading of the present application, various barrier layers or liner layers (neither of which is shown) may be formed as part of the process of forming the illustrative conductive interconnect structures 114. Moreover, various additional conductive structures that will be formed on the IC product 100, as discussed more fully below, may or may not include such illustrative barrier layers and/or liner layers, which are not depicted so as to not overly complicate the attached drawings.

Figure 2:
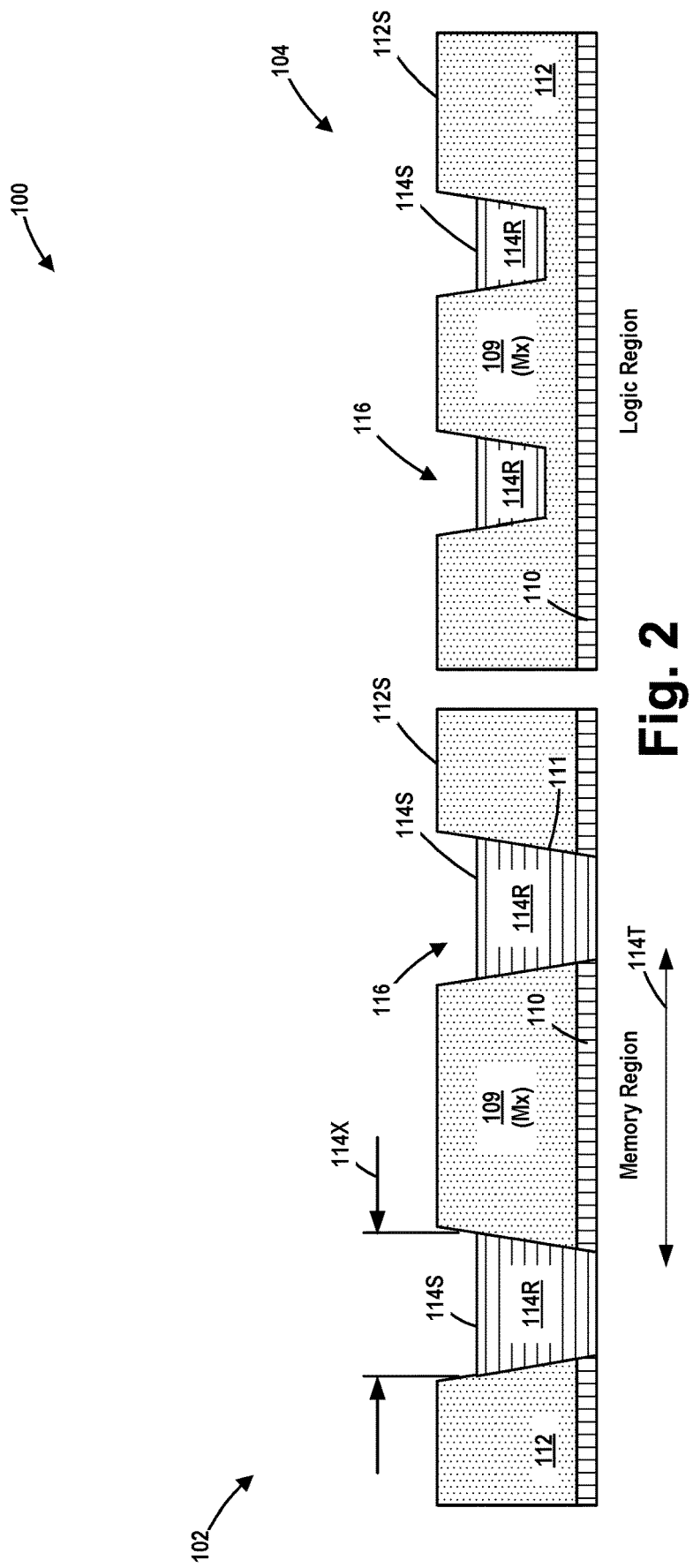

FIG. 2 depicts the IC product 100 after a recess etching process was performed to remove portions of the conductive interconnect structures 114 in both the memory region 102 and the logic region 104. At the conclusion of the recess etching process, the conductive interconnect structures 114 have a recessed upper surface 114S and are now identified with the numeral 114R. As depicted, a recess 116 is formed above each of the recessed conductive interconnect structures 114R. The amount of recessing of the conductive interconnect structures 114 may vary depending upon the particular application. In one illustrative example, based on current-day technology, the depth of the recesses 116 may be about 10-30 nm. Note that, in the depicted example, the recessed upper surface 114S of the recessed conductive interconnect structures 114R is positioned at a level that is below the level of the upper surface 112S of the layer of insulating material 112. Also note that the recessed upper surface 114S of the recessed conductive interconnect structures 114R has a lateral width 114X as measured in the direction 114T that may vary depending upon the particular application. In one illustrative embodiment, the dimension 114X may be about 30-80 nm.

Figure 3:
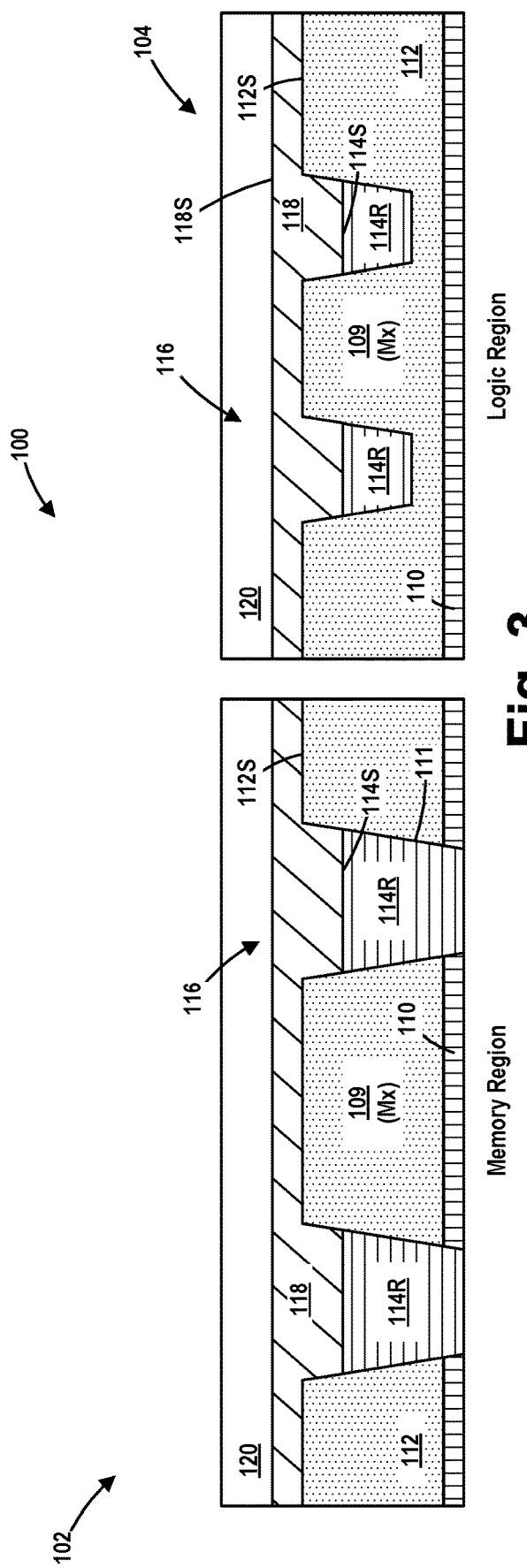

FIG. 3 depicts the IC product 100 after several process operations were performed. First, another dielectric layer 118 was formed on the upper surface 112S of the layer of insulating material 112. The dielectric layer 118 has an upper surface 118S. Note that the dielectric layer 118 overfills the recesses 116 above the recessed conductive interconnect structures 114R. The portions of the dielectric layer 118 positioned in and above the recesses 116 constitute an insulating cap layer for each of the recessed conductive interconnect structures 114R. Thereafter, another layer of insulating material 120 was formed above the dielectric layer 118. The dielectric layer 118 may be comprised of a variety of different materials depending upon the particular application, including those identified above for the etch-stop layer 110. The insulating material 120 may be comprised of a variety of different insulating materials, e.g., silicon dioxide. The vertical thickness of the dielectric layer 118 (above the upper surface 112S) and the thickness of the layer of insulating material 120 may vary depending upon the particular application.

Figure 4:
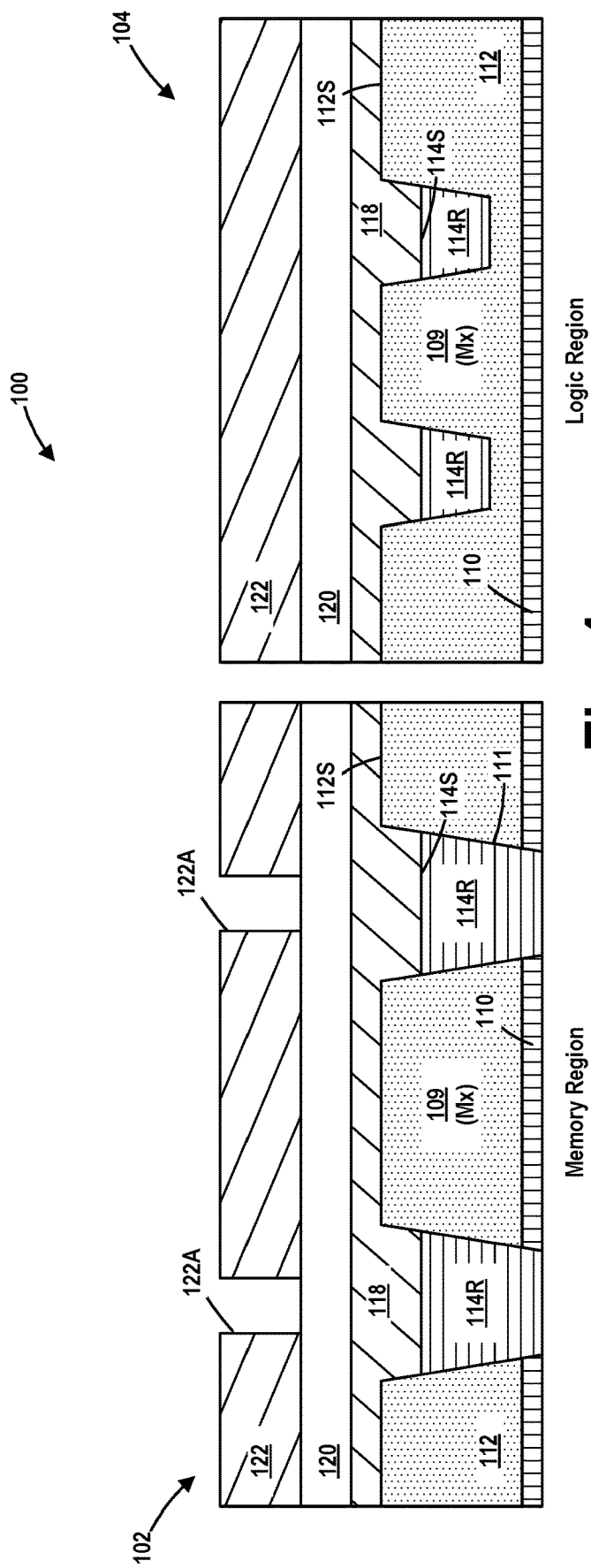

FIG. 4 depicts the IC product 100 after an illustrative and representative patterned etch mask 122 was formed on the product 100. The patterned etch mask 122 may comprise one or more layers of material, and it may be formed using techniques known to those skilled in the art. The patterned etch mask 122 covers the logic region 104 but includes a plurality of openings 122A that expose portions of the layer of insulating material 120 at locations in the memory region 102 where it is desired to establish electrical contact with the recessed conductive interconnect structures 114R formed in the metallization layer 109 ($M_x$) within the memory region 102.

Figure 5:
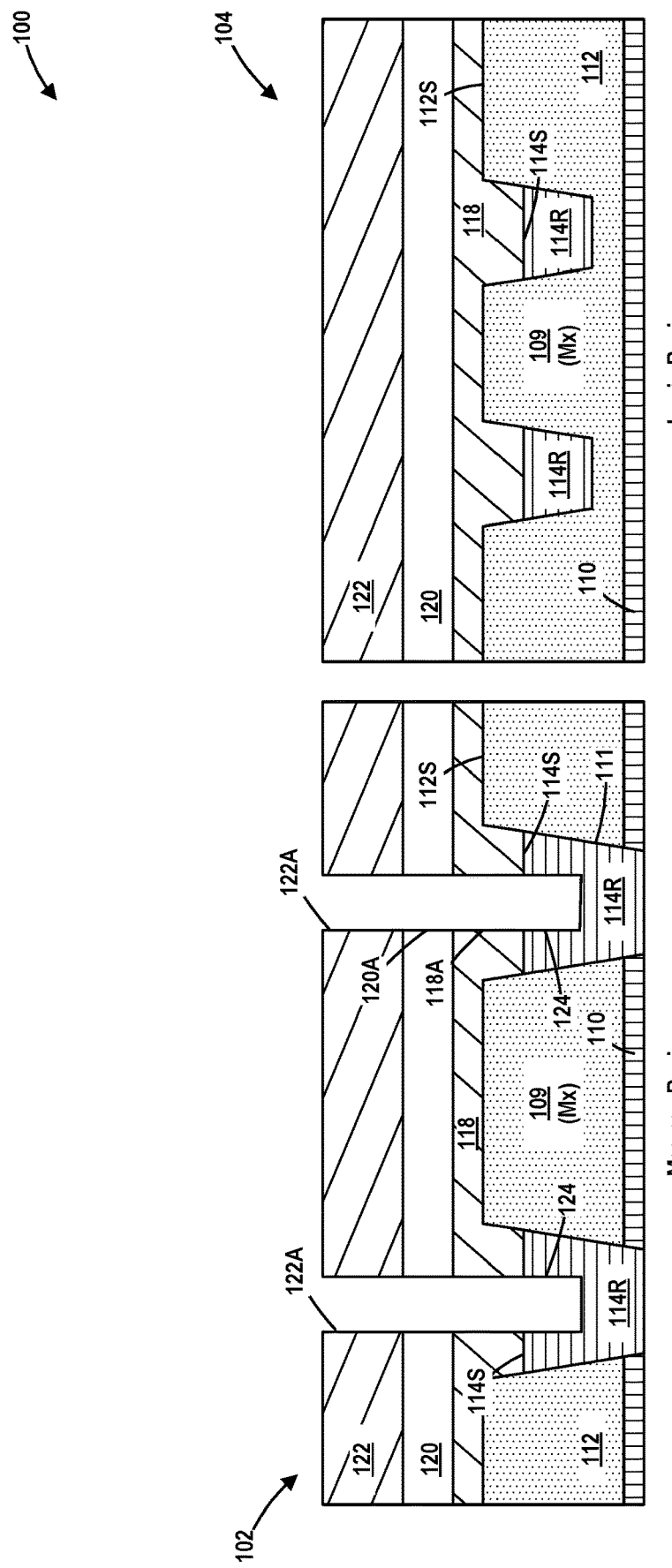

FIG. 5 depicts the IC product 100 after one or more etching processes were performed to remove exposed portions of the layer of insulating material 120, the dielectric layer 118 and portions of the recessed conductive interconnect structures 114R. In some cases, the patterned etch mask 122 may remain in position during all of the following etching processes. In other cases, the patterned etch mask 122 may be removed after one or more etching processes is performed, e.g., it may be removed after formation of the openings in the layer of insulating material 120. As the conclusion of these etching processes, openings 120A are formed in the layer of insulating material 120, openings 118A are formed in the dielectric layer 118 and a recess 124 is formed in each of the recessed conductive interconnect structures 114R in the memory region 102. Note that the logic region 104 remains covered during these etching processes. In one illustrative example, based on current-day technology, the depth of the recesses 124 may be about 10-20 nm. In one illustrative embodiment, when viewed from above, the recesses 124 may have a substantially circular configuration. In other situations, the recesses 124 may have a substantially oval or rectangular configuration.

Figure 6:
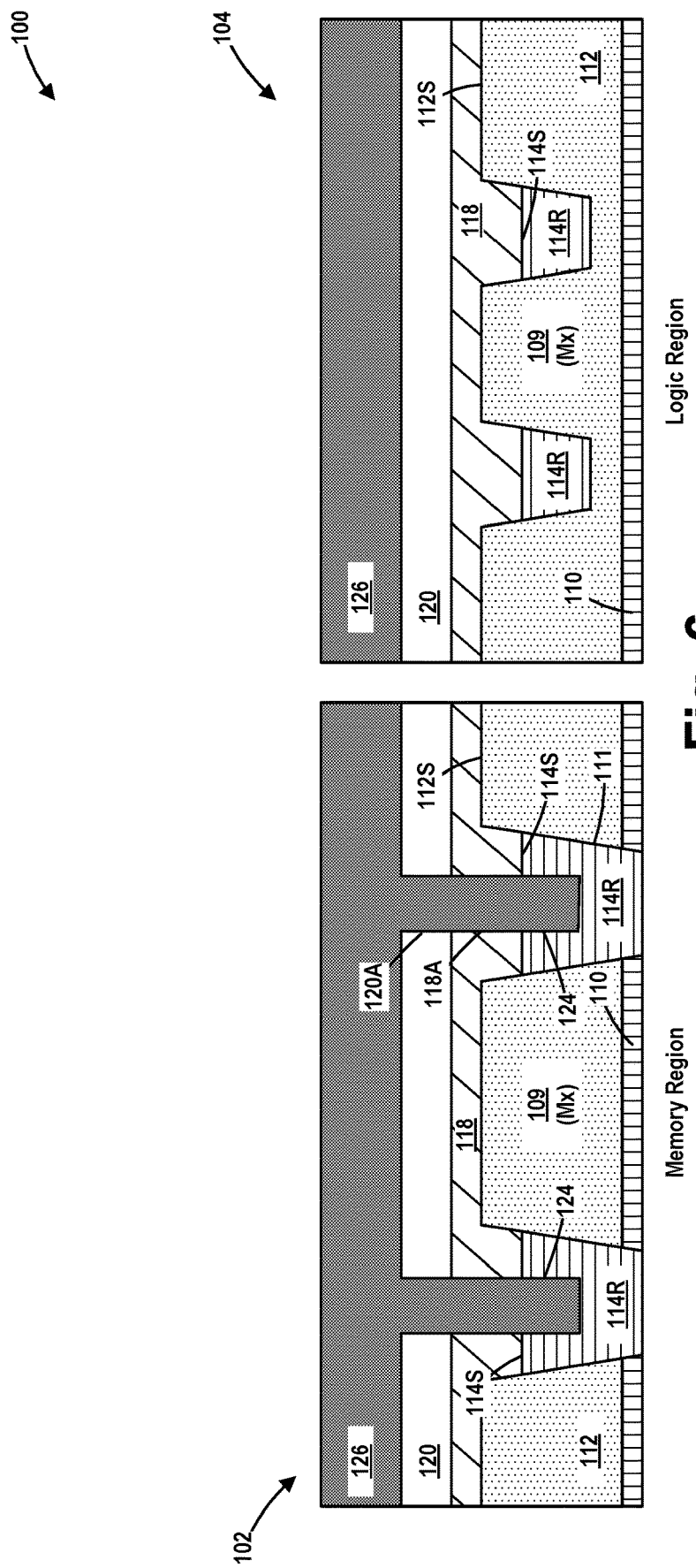

FIG. 6 depicts the IC product after one or more conductive materials 126 were formed on the product. The conductive material(s) 126 overfills the recesses 124 in the recessed conductive interconnect structures 114R as well as the openings in the dielectric layer 118 and the layer of insulating material 120. The conductive material 126 may be comprised of a variety of different materials, e.g., tungsten, etc. Moreover, the conductive material(s) may comprise a conformal liner layer (not separately shown), e.g., TaN, that is formed prior to overfilling the openings with a bulk conductive material.

Figure 7:
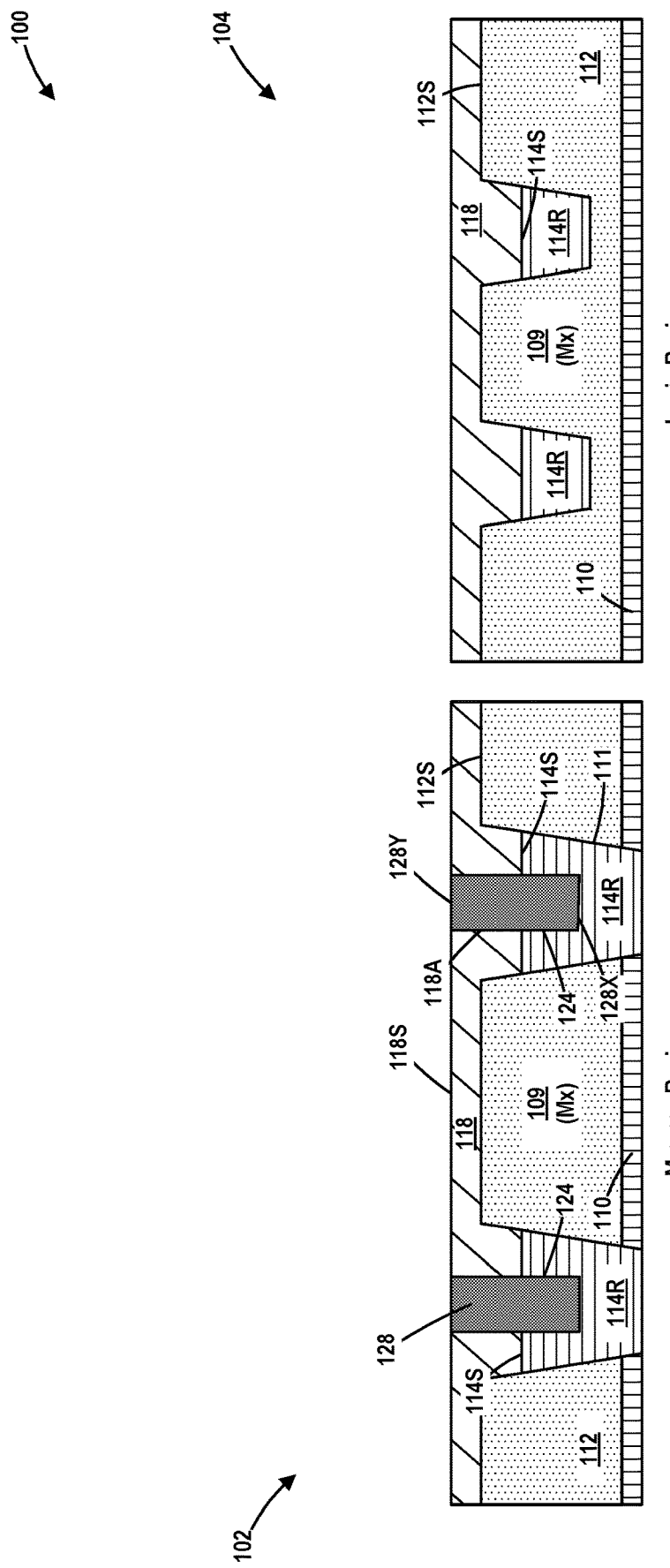

FIG. 7 depicts the IC product 100 after one or more planarization processes, e.g., CMP or etch-back processes, were performed to remove the layer of insulating material 120 and portions of the conductive material(s) 126 positioned above the upper surface 118S of the dielectric layer 118. These process operations result in the formation of a conductive via plug 128 that extends into the recess 124 formed in the recessed conductive interconnect structures 114R in the memory region 102. Accordingly, the conductive via plugs 128 are conductively coupled to the recessed conductive interconnect structures 114R in the memory region 102. The overall vertical height of the conductive via plugs 128 may vary depending upon the particular application. In one illustrative embodiment, based upon current-day technology, the overall vertical height of the conductive via plugs 128 may be about 20-40 nm. Note that a bottom surface 128X of the conductive via plug 128 is positioned below the level of the recessed upper surface 114S of the recessed conductive interconnect structures 114R. Also note that an upper surface 128Y of the conductive via plug 128 is substantially level or coplanar with the upper surface 118S of the dielectric layer 118.

Figure 8:
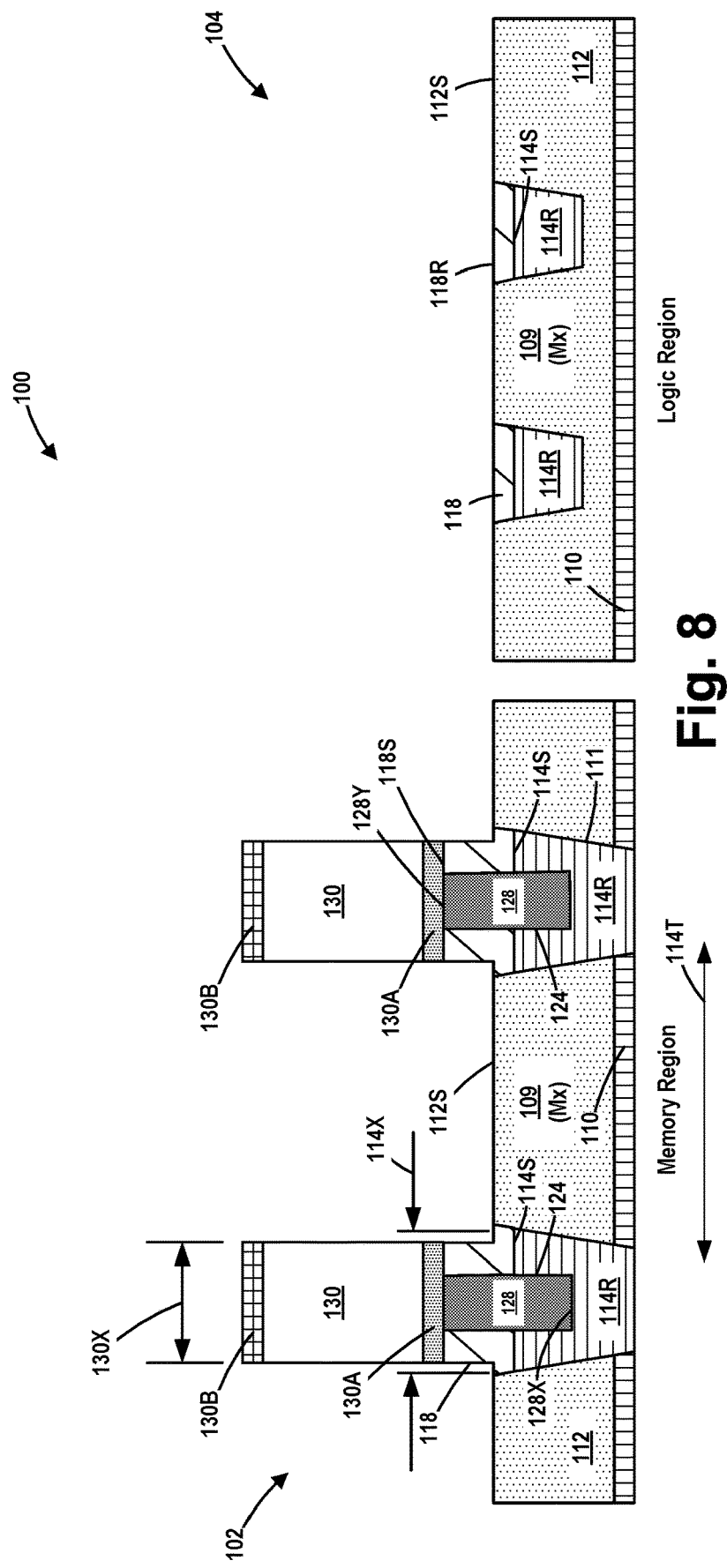

FIG. 8 depicts the IC product 100 after several process operations were performed to form illustrative and representative memory cells 130 in the memory region 102 by performing traditional manufacturing techniques and to remove portions of the dielectric layer 118. In one illustrative example, the memory cells 130 may be formed by depositing various layers of material and thereafter etching those materials to define each memory cell 130. Each of the memory cells 130 comprises a lower conductive material 130A and an upper conductive material 130B. As noted previously, in one illustrative example, the conductive material 130A may be the bottom electrode of the memory cell 130, while the conductive material 130B may be the top electrode of the memory cell. The memory cell 130 depicted herein is intended to be generic and representative in nature. By way of example only, and not by way of limitation, the generic memory cells 130 depicted herein may take a variety of forms, have a variety of different configurations and may comprise different materials. For example, the cell 130 depicted herein may be an MTJ (magnetic tunnel junction) memory device, an RRAM (resistive random access memory) device, a PRAM (phase-change random access memory) device, an MRAM (magnetic random access memory) device, a FRAM (ferroelectric random access memory) device, etc. Additionally, in some applications, different types of such memory cells may be formed on the same IC product 100. The memory cells 130 disclosed herein includes some form of memory state material that is typically positioned between a bottom electrode (e.g., the conductive material 130A) and a top electrode (e.g., the conductive material 130B). As depicted, the bottom electrode of each of the memory cells 130 is conductively coupled to the underlying via plug 128 and ultimately the underlying recessed conductive interconnect structures 114R. In some applications, some characteristic of the memory state material of the memory cell 130, e.g., resistivity, may be altered by the application of an electrical charge to the memory cell 130, and these altered states may be representative of a logical "1" or a logical "0" in a digital circuit. In some situations, the memory state material of the memory cell 130 may actually store an electrical charge. In any event, sensing circuitry on the IC product 100 may be used to sense the state of the memory state material of the memory cell 130, to determine whether or not a particular memory cell 130 represents a logical "1" or a logical "0" and use that information within the various circuits on the IC product 100. The particular materials used for the memory state material in the memory cell 130 may vary depending upon the particular type of memory cell 130 that is fabricated. Moreover, in a real-world device, the memory state material of the memory cell 130 may comprise a plurality of layers of material. Thus, the reference to any "memory state material" in the specification and in the attached claims should be understood to cover any form of any material(s) that may be employed on any form of a memory cell 130 that can be manipulated or changed so as to reflect two opposite logical states of the memory cell 130. In one illustrative embodiment, when viewed from above, each of the memory cells 130 may have a substantially circular configuration, but the configuration of the memory cells 130 should not be considered to be a limitation of the subject matter disclosed herein.

With continued reference to FIG. 8, the memory cells 130 have a lateral width 130X as measured at the bottom of the memory cell 130 in the direction 114T. As depicted, in one illustrative embodiment disclosed herein, the lateral width 130X of the memory cells 130 is less than the lateral width 114X of the upper surface 114S of the recessed conductive interconnect structures 114R. The lateral width 130X of the memory cells 130 may vary depending upon the particular application. In one illustrative embodiment, the lateral width 130X may be about 20-70 nm.

In one illustrative example, the etching process used to form the memory cells 130 may be a highly non-selective anisotropic etching process, e.g., an IBE (Ion-Beam-Etching) process. This highly non-selective anisotropic etching process results in the removal of exposed portions of the dielectric layer 118 from above the upper surface 112S of the layer of insulating material 112 in both the memory region 102 and the logic region 104 and consumes some of the layer of insulating material 112, as depicted in the drawings. As indicated, portions of the dielectric layer 118 remain positioned above the recessed conductive interconnect structures 114R in both the memory region 102 and the logic region 104. As will be appreciated by those skilled in the art, the remaining portions of the dielectric layer 118 that are positioned under the memory cell 130 and above the recessed upper surface 114S of the recessed conductive interconnect structure 114R constitute an insulating cap layer wherein at least a portion of the conductive via plug 128 extends through the insulating cap layer. Also note that, in the depicted example, the upper surface 128Y of the conductive via plug 128 is substantially co-planar with the upper surface 118S of this insulating cap layer.

Figure 9:
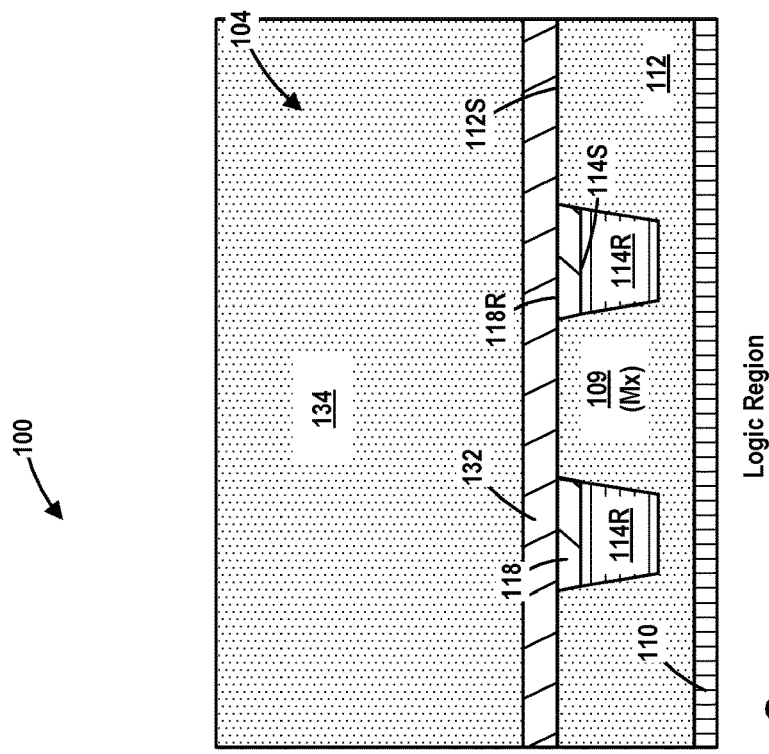
Figure 9:
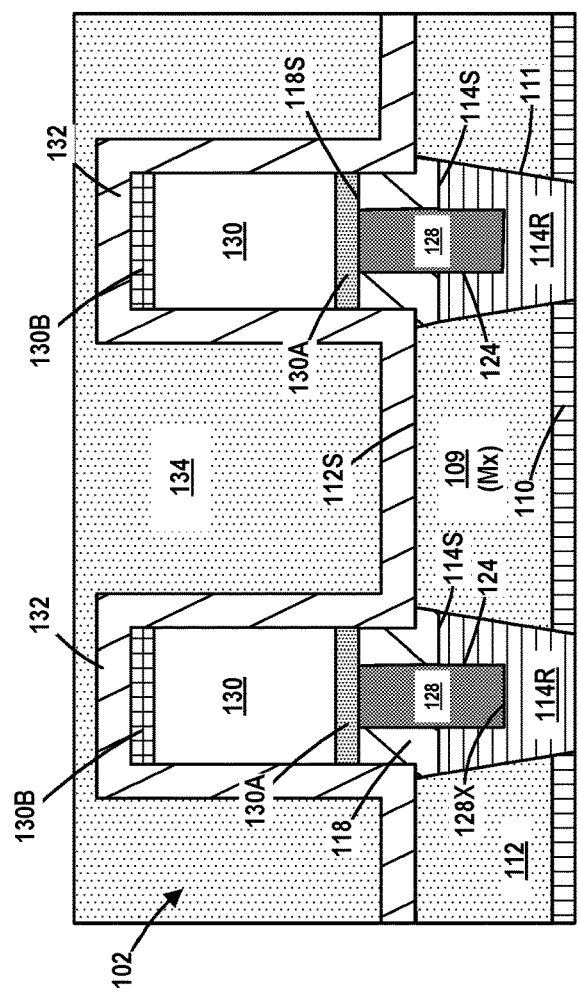

FIG. 9 depicts the IC product after several process operations were performed. First, a conformal layer of encapsulation material 132 was formed on the product 100. The conformal layer of encapsulation material 132 may be formed to any desired thickness and it may be comprised of a variety of materials, e.g., silicon nitride. Thereafter, a layer of insulating material 134, e.g., silicon dioxide, SiCOH, etc., was blanket-deposited on the product 100.

Figure 10:
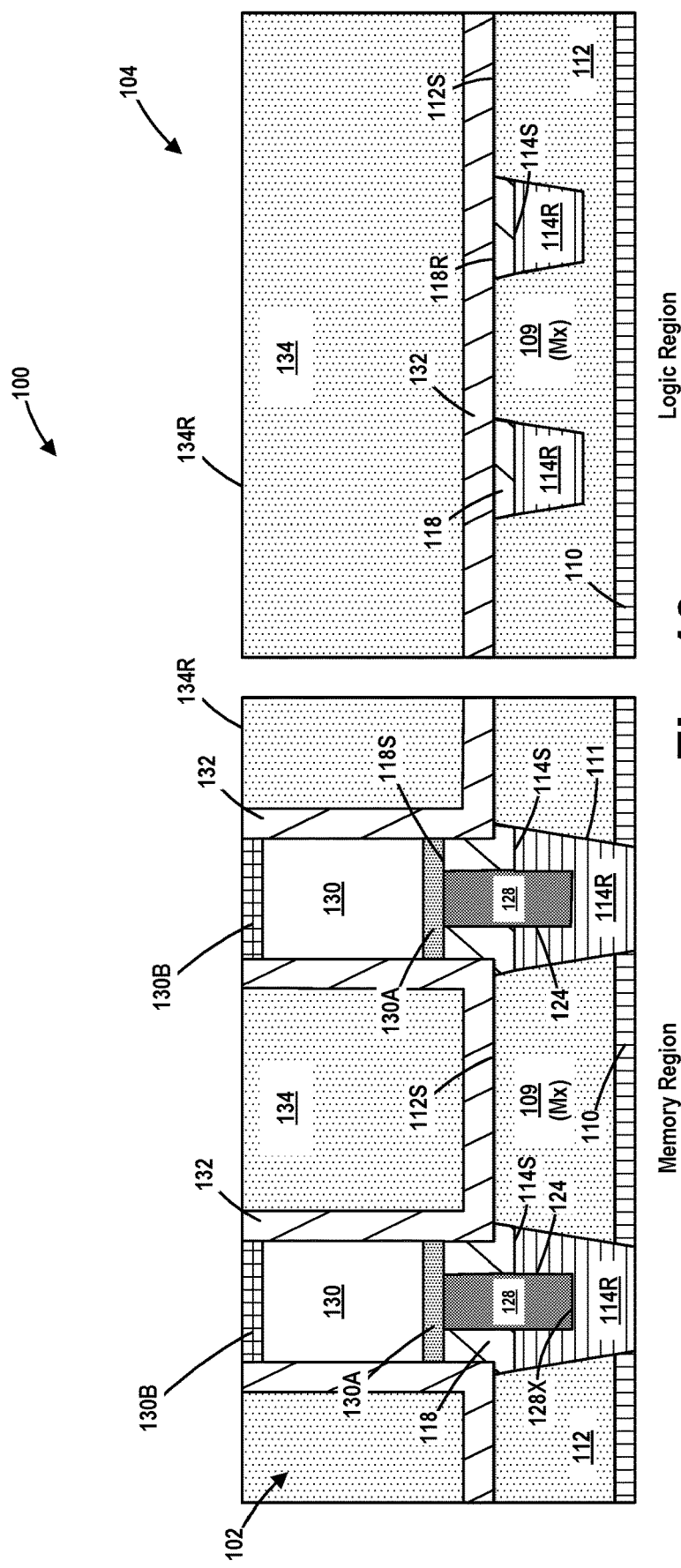

FIG. 10 depicts the product 100 after one or more planarization processes were performed to remove portions of the layer of insulating material 134 (now with a recessed upper surface 134R) and portions of the layer of encapsulation material 132 positioned above the memory cells 130. This process operation exposes the upper conductive material 130B of the memory cells 130. Note that the layer of encapsulation material 132 is positioned around the sidewalls of each of the memory cells 130, thereby laterally encapsulating each memory cell 130.

Figure 11:
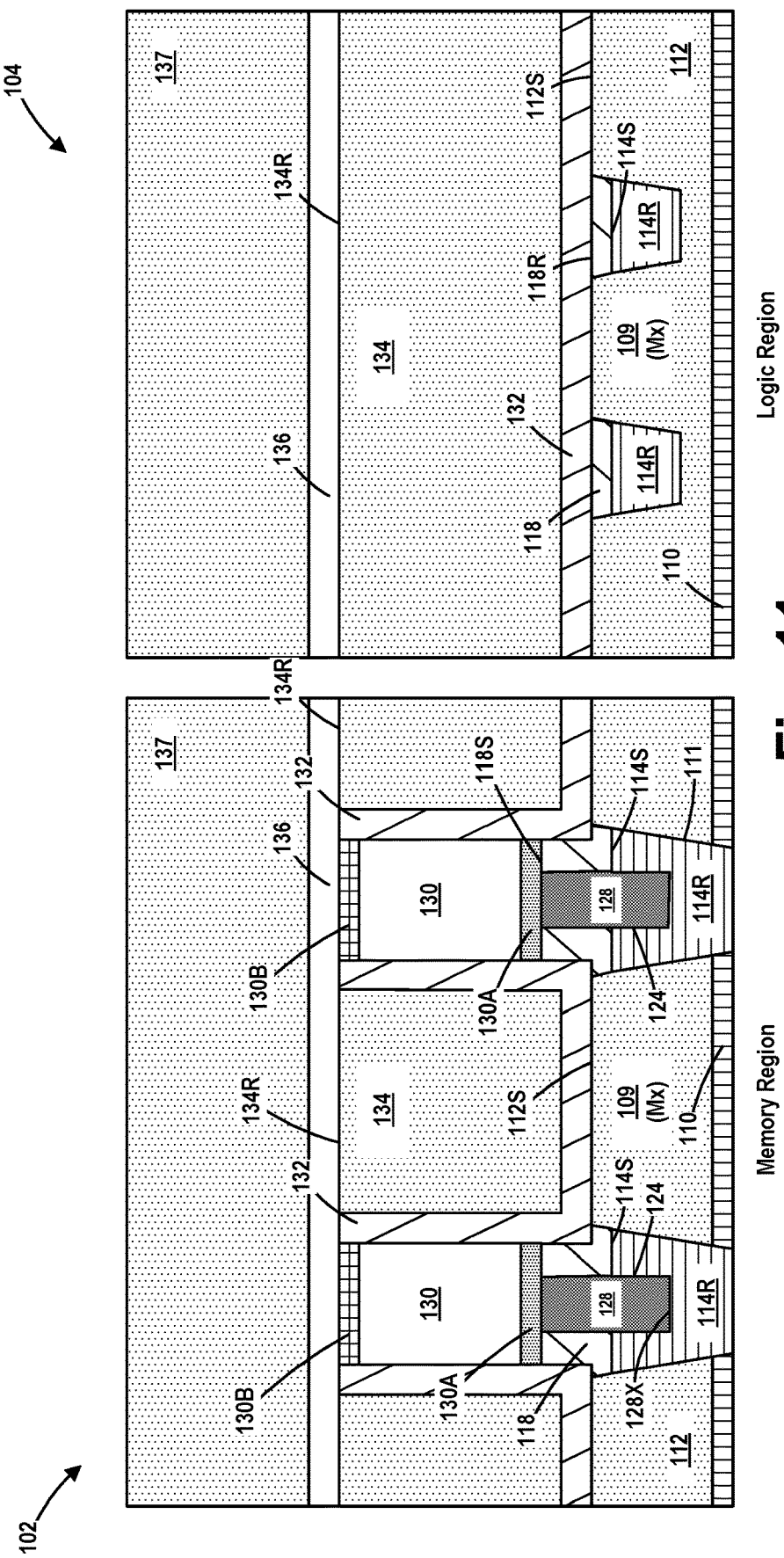

FIG. 11 depicts the IC product 100 after several process operations were performed. First, another etch-stop layer 136 was formed on the upper surface 134R of the layer of insulating material 134. Note that the etch-stop layer 136 covers the previously exposed upper conductive material 130B of the memory cells 130. Thereafter, another layer of insulating material 137 was formed above the etch-stop layer 136. The etch-stop layer 136 may be comprised of a variety of different materials depending upon the particular application, including those identified above for the etch-stop layer 110. The insulating material 137 may be comprised of a variety of different insulating materials, e.g., silicon dioxide, SiCOH. The vertical thickness of the etch-stop layer 136 and the thickness of the layer of insulating material 137 may vary depending upon the particular application.

Figure 12:
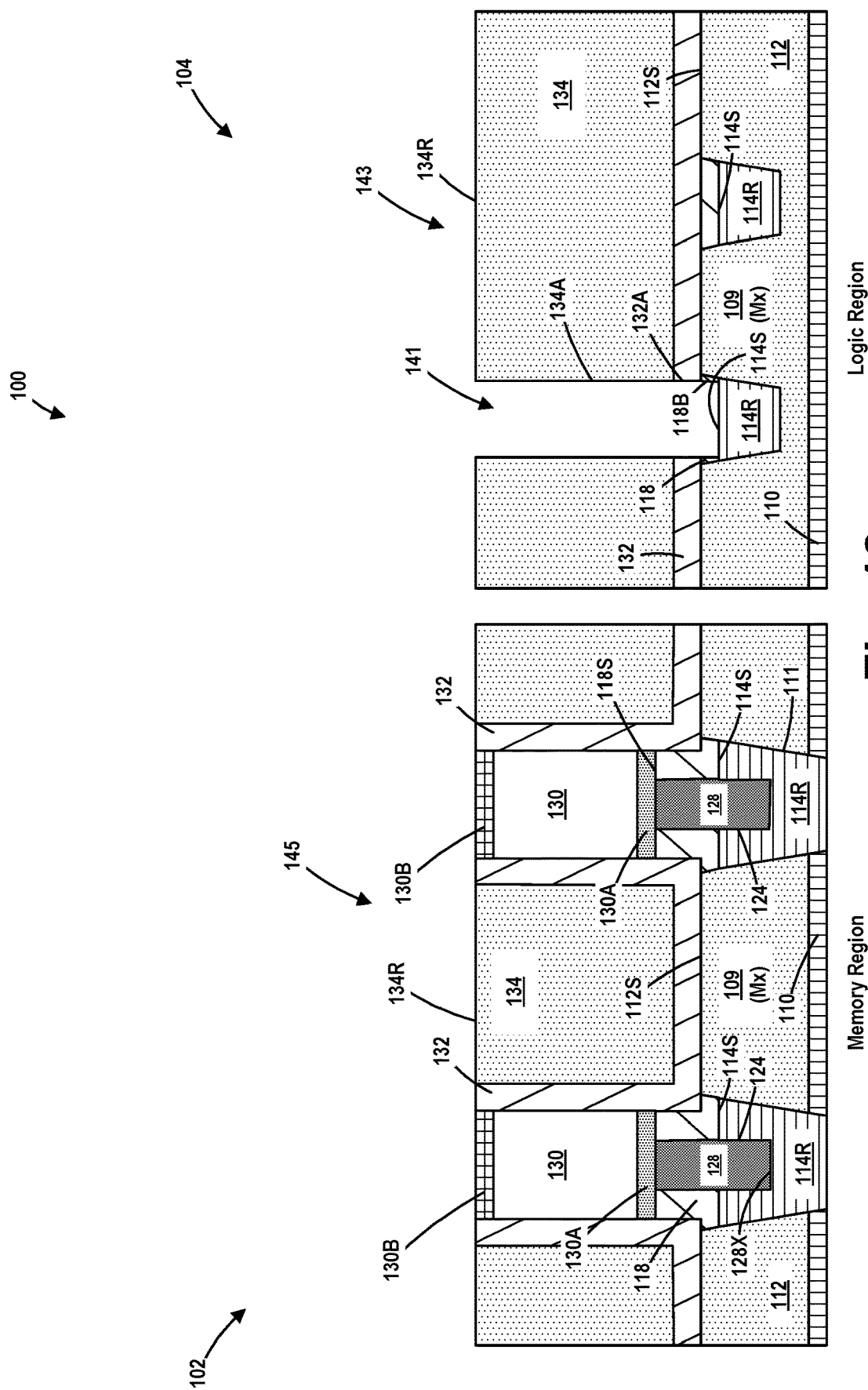

FIG. 12 depicts the IC product 100 after traditional masking and etching techniques were performed to form an illustrative via opening 141 and a trench 143 in the logic region 104 and a trench 145 in the memory region 102. As depicted, the trench 145 removes the portions of the insulating material 137 and the etch stop layer 136 that are positioned above the upper conductive material 130B of the memory cells 130. The via opening 141 comprises the openings 134A, 132A and 118B and exposes the upper surface 114S of the recessed conductive interconnect structure 114R in the logic region 104.

Figure 13:
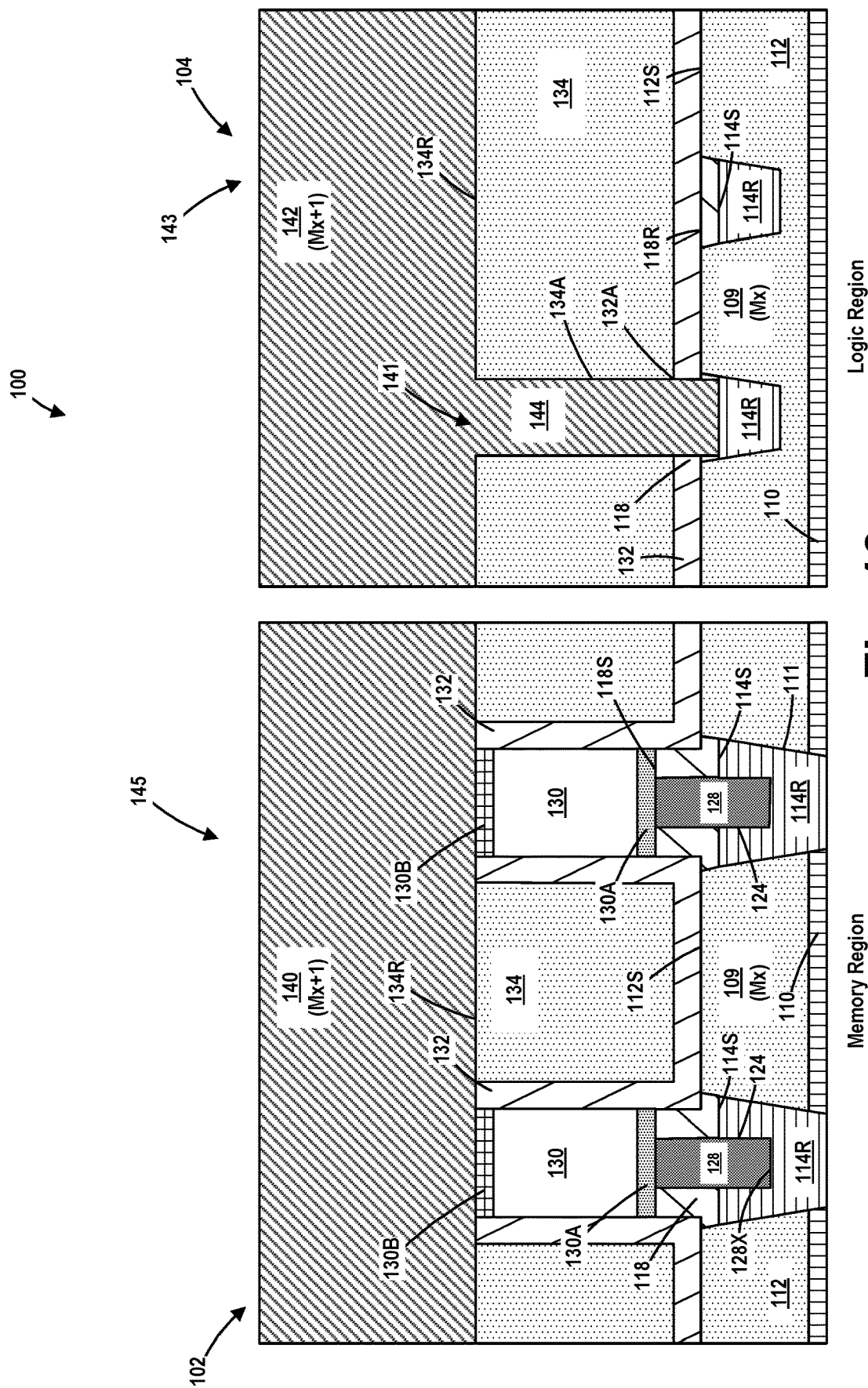

FIG. 13 depicts the IC product 100 after various conductive structures were formed in the next metallization layer ($M_{x+1}$). More specifically, a conductive line 140 was formed in the trench 145. As depicted, the conductive line 140 is conductively coupled to each of the memory cells 130. Another conductive line 142 was formed in the trench 143 in the logic region 104 and a conductive via 144 was formed in the via opening 141. As depicted, the conductive line 142 is conductively coupled to the recessed conductive interconnect structure 114R in the logic region 104 by the conductive via 144.

Figure 14:
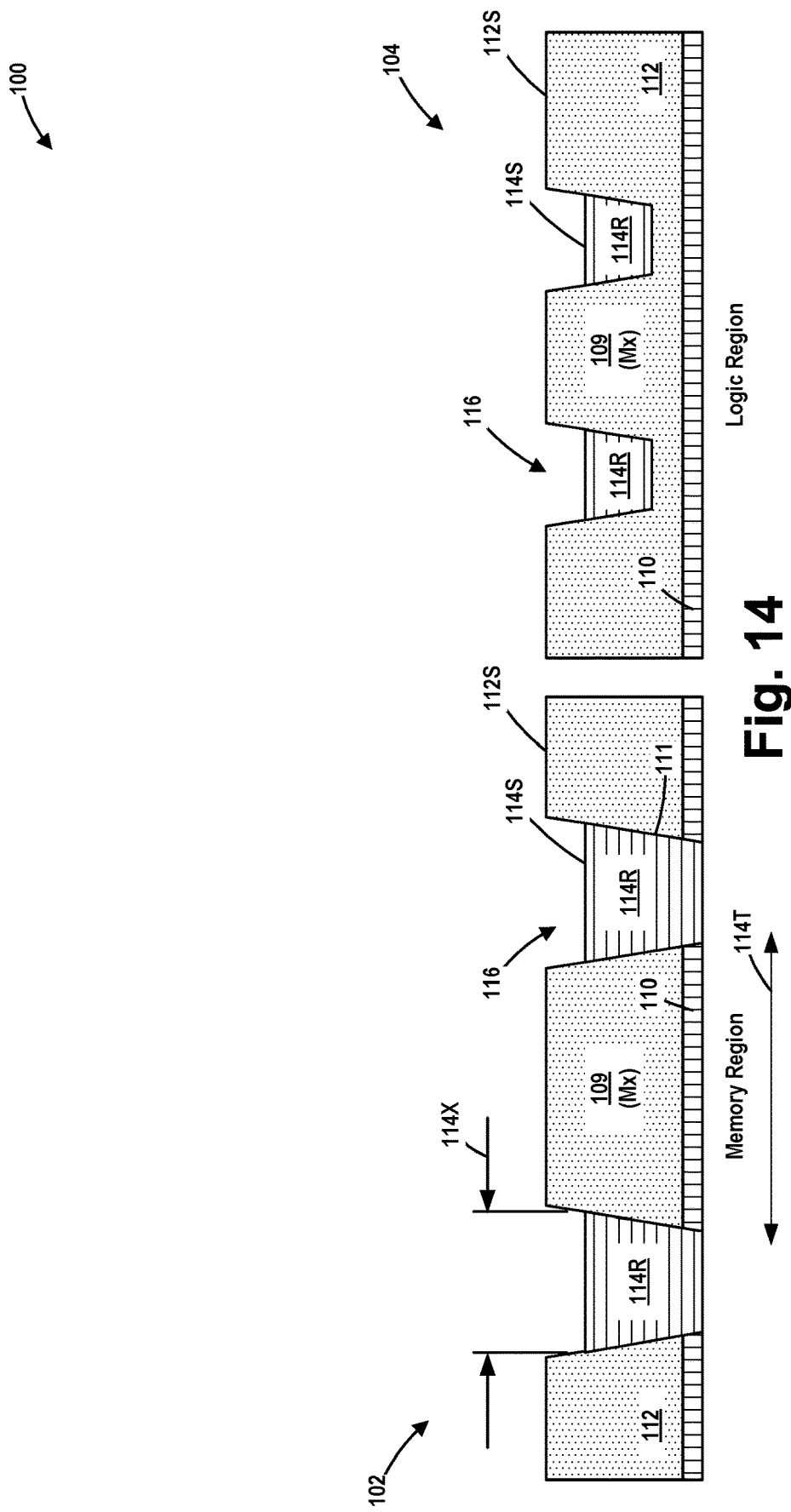
FIGS. 14-22 depict other novel methods of forming conductive contact structures to an embedded memory device on IC product and an IC product having such a novel corresponding configuration.

FIGS. 14-22 depict other novel methods of forming conductive contact structures to an embedded memory device on an IC product and an IC product having such a novel corresponding configuration. FIG. 14 depicts the IC product 100 at a point in fabrication that corresponds to that shown in FIG. 2, i.e., after the recess etching process was performed to form the recess 116 above each of the recessed conductive interconnect structures 114R.

Figure 15:
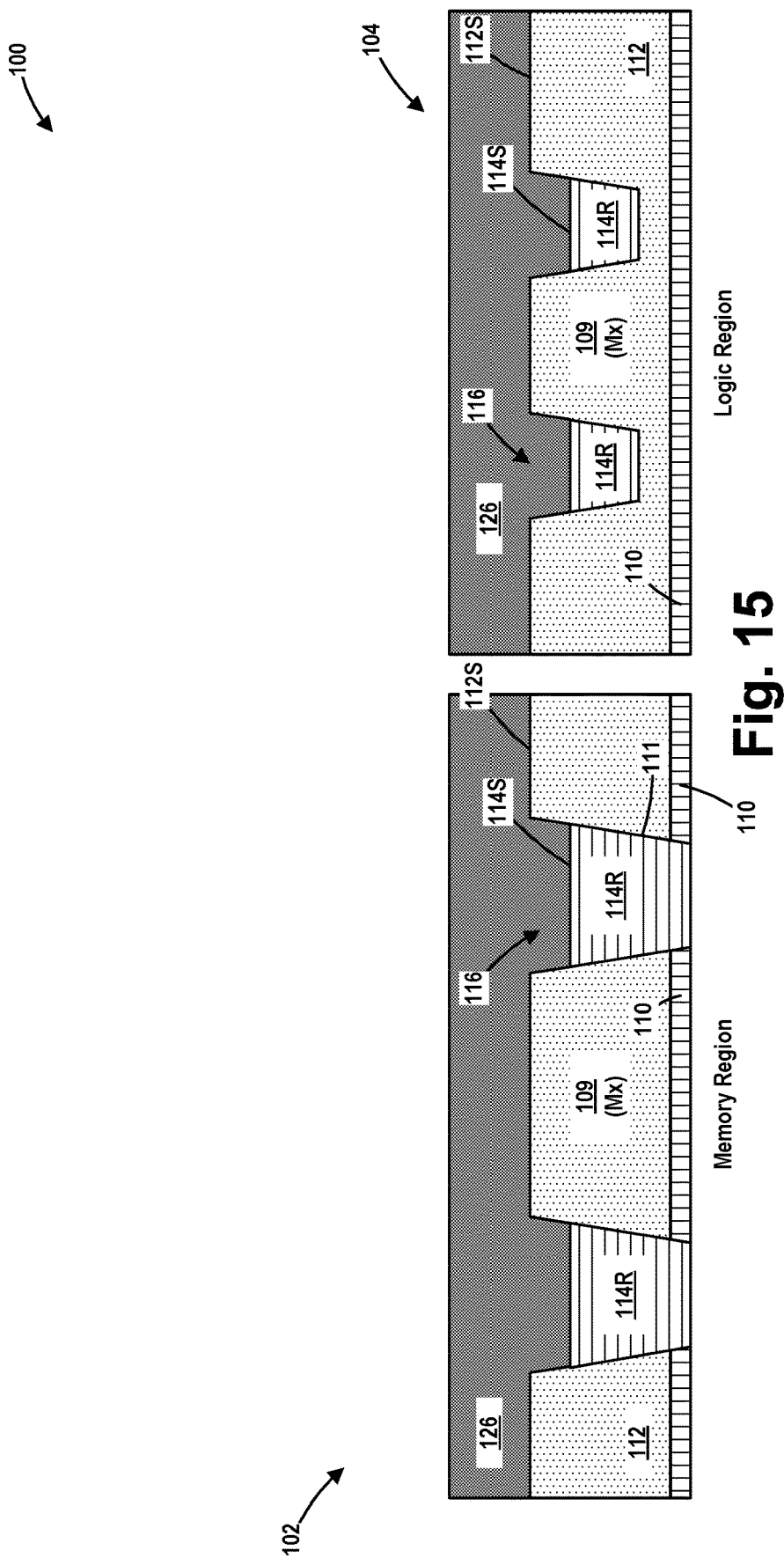

FIG. 15 depicts the IC product 100 after the above-described conductive material(s) 126 was formed on the IC product 100. Note that the conductive material(s) 126 overfills the recesses 116 above the recessed conductive interconnect structures 114R in both the memory region 102 and the logic region 104.

Figure 16:
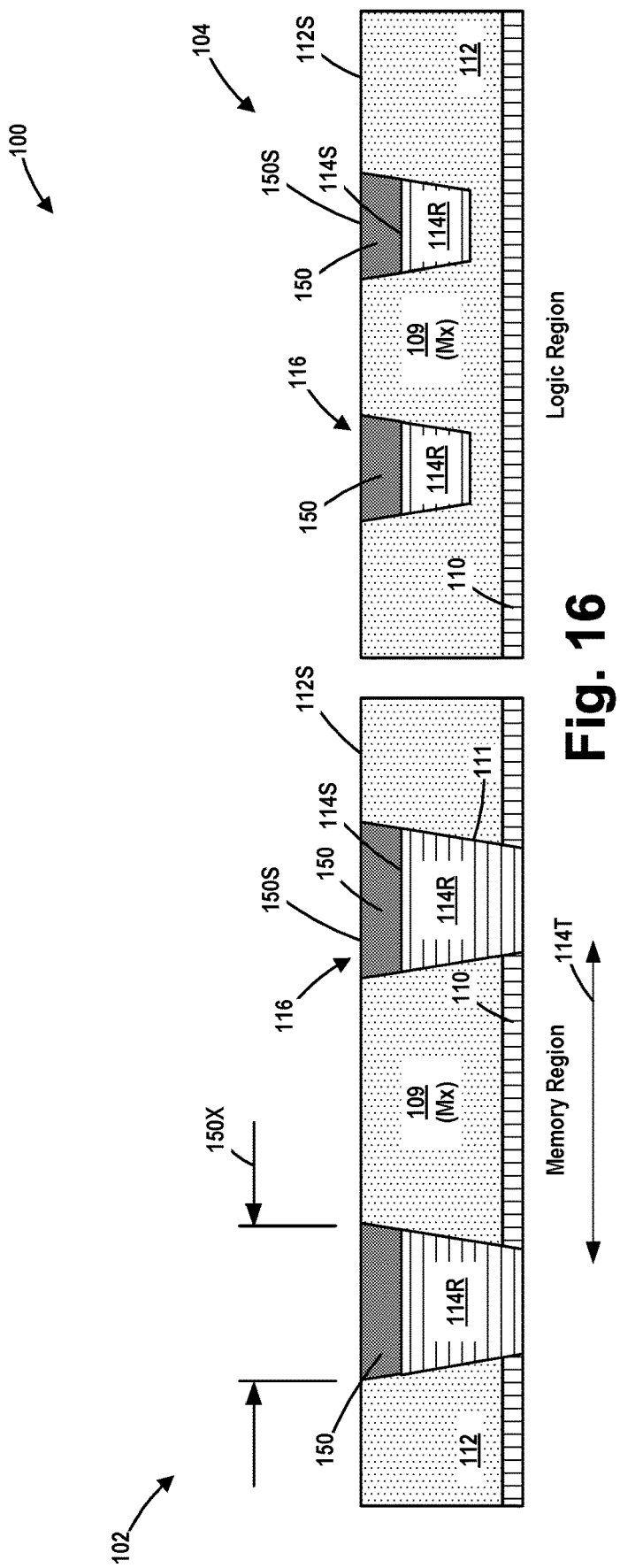

FIG. 16 depicts the IC product 100 after one or more planarization processes, e.g., CMP and/or etch-back processes, were performed to remove portions of the conductive material(s) 126 positioned above the upper surface 112S of the layer of insulating material 112. This results in the formation of a conductive cap layer 150 positioned in the recess 116 above each of the recessed conductive interconnect structures 114R in both the memory region 102 and the logic region 104. In one illustrative embodiment, an upper surface 150S of the conductive cap layer 150 is substantially co-planar with the upper surface 112S of the layer of insulating material 112. Also note that the upper surface 150S of the conductive cap layer 150 has a lateral width 150X as measured in the direction 114T that may vary depending upon the particular application. In one illustrative embodiment, the dimension 150X may be about 15-30 nm.

As shown in FIG. 16, in one illustrative example, the recessed conductive interconnect structures 114R are comprised of a first bulk conductive material, e.g., copper, cobalt, ruthenium, etc., while the conductive cap layer 150 is comprised of a second bulk conductive material, e.g., tungsten, tantalum nitride, etc., that is different from the first bulk conductive material in the recessed conductive interconnect structure 114R. One reason for the use of a material such as tungsten is to facilitate planarization of the conductive cap layer 150. Of course, the conductive cap layer 150 may be comprised of other materials or multiple layers of material. For example, in one illustrative embodiment, the conductive cap layer 150 may be formed by depositing tungsten into the recesses 116, performing a planarization process and thereafter performing a deposition process to form a thin liner of tantalum nitride on the planarized tungsten material. In other cases, the formation of the conductive cap layer 150 may involve depositing tungsten and then tantalum nitride in the recesses 116 followed by performing a planarization process to remove the conductive materials positioned outside of the recesses 116 and above the upper surface of the layer of insulating material 112. In some cases, the recessed conductive interconnect structure 114R and the conductive cap layer 150 may comprise one or more barrier or liner layer that are made of the same or different materials. Also note that this unique structure—the recessed conductive interconnect structure 114R with the conductive cap layer 150 positioned thereon—is present in both the memory region 102 and the logic region 104.

Figure 17:
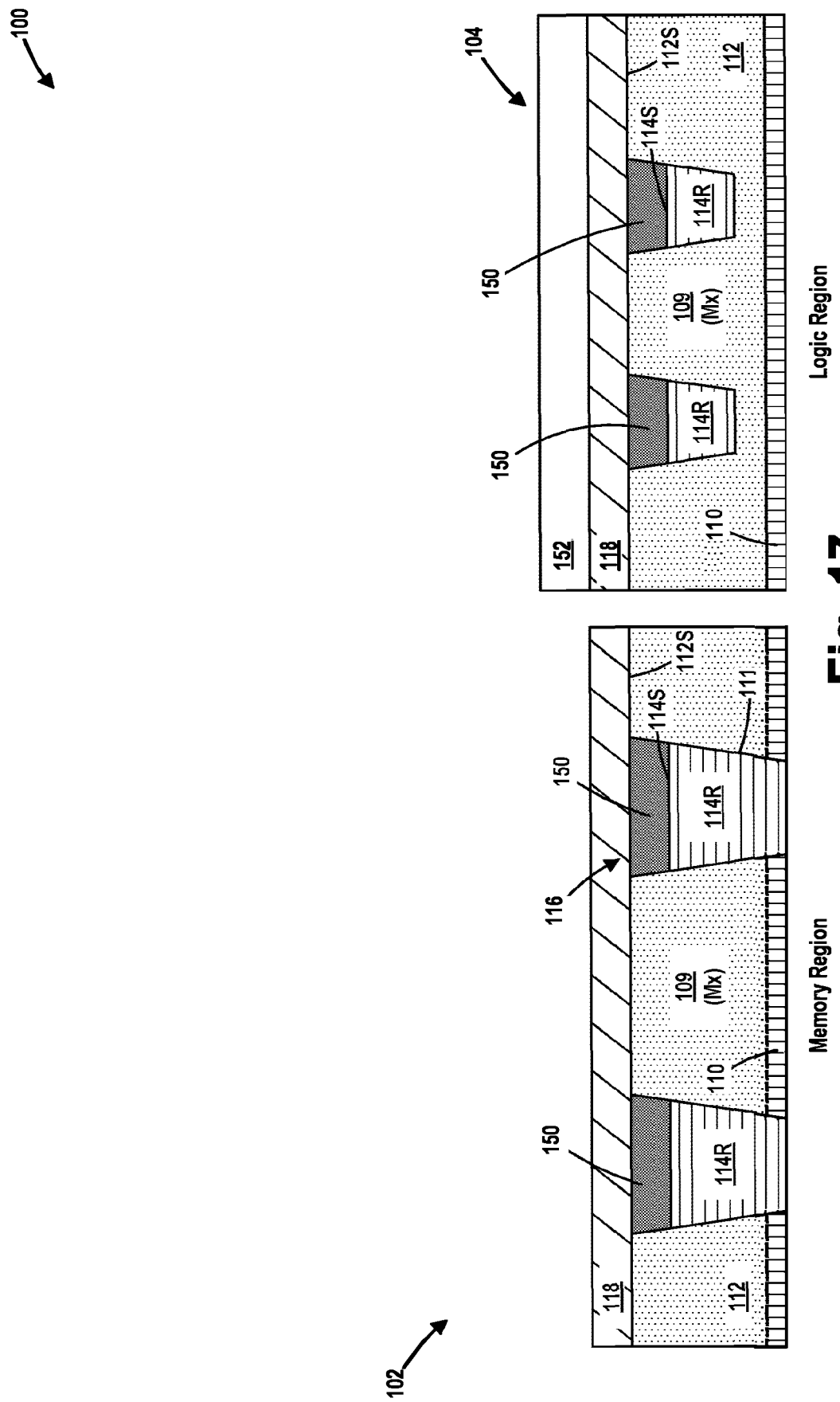

FIG. 17 depicts the product after several process operations were performed. First, the above-described dielectric layer 118 was formed on the product 100. Thereafter, an illustrative and representative patterned etch mask 152 was formed on the product 100. The patterned etch mask 152 may comprise one or more layers of material, e.g., photoresist, and it may be formed using techniques known to those skilled in the art. The patterned etch mask 152 covers the logic region 104 but exposes the memory region 102 for further processing.

Figure 18:
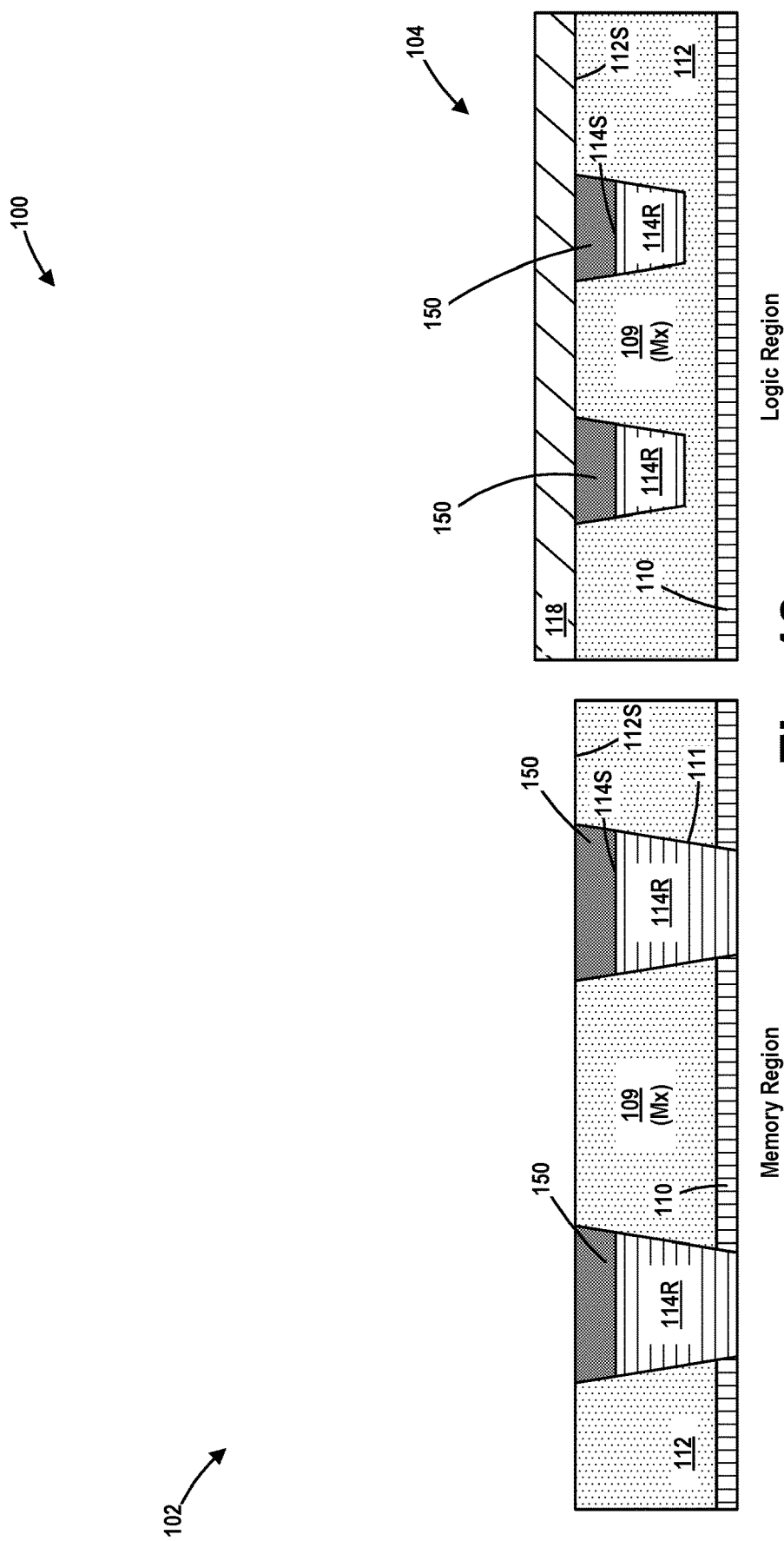

FIG. 18 depicts the product after several process operations were performed. First, an etching process was performed to remove the above-described dielectric layer 118 from the memory region 102 while leaving the dielectric layer 118 in position within the logic region 104. The absence of the dielectric layer 118 in the memory region 102 results in the exposure of the conductive cap layers 150 in the memory region 102. Then, the patterned etch mask 152 was removed from the product.

Figure 19:
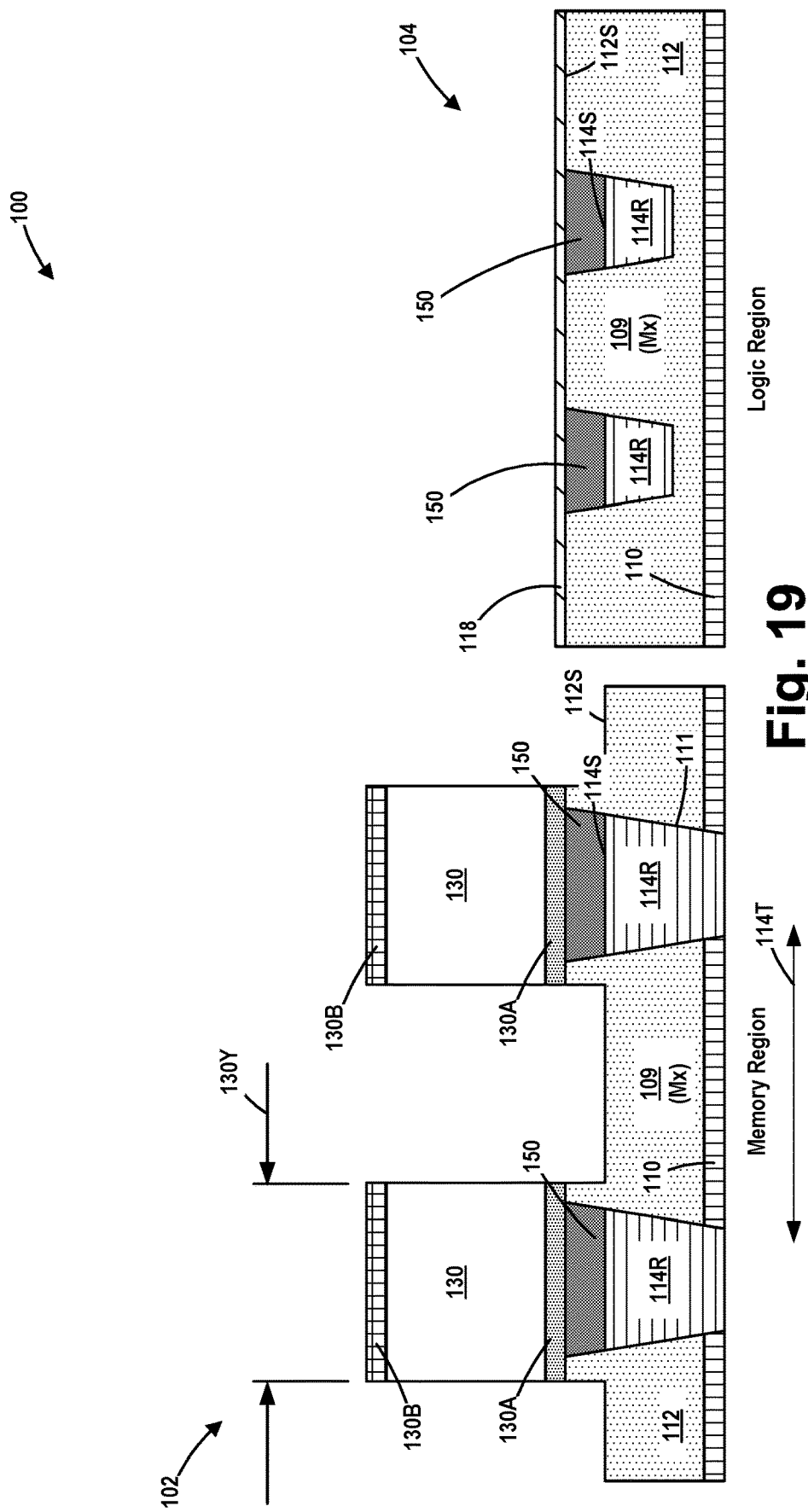

FIG. 19 depicts the product after a plurality of memory cells 130 were formed in the memory region 102 of the product 100. The memory cells 130 have a lateral width 130Y as measured at the bottom of the bottom electrode 130A of the memory cell 130 in the direction 114T. However in this embodiment, the lateral width 130Y of the memory cells 130 is greater than the lateral width 150X (see FIG. 16) of the upper surface 150S of the conductive cap layers 150. The lateral width 130Y of the memory cells 130 shown in FIG. 19 may vary depending upon the particular application. In one illustrative embodiment, the lateral width 130Y may be about 20-80 nm. Note that the lower conductive material 130A of the memory cells 130 contacts and conductively engages the conductive cap layers 150. In one illustrative process flow, some of the layer of insulating material 112 in the memory region may be lost as well, as depicted in the drawing. Additionally, as depicted, some amount of the vertical thickness of the dielectric layer 118 in the logic region will be lost during the process of forming the memory cells 130.

Figure 20:
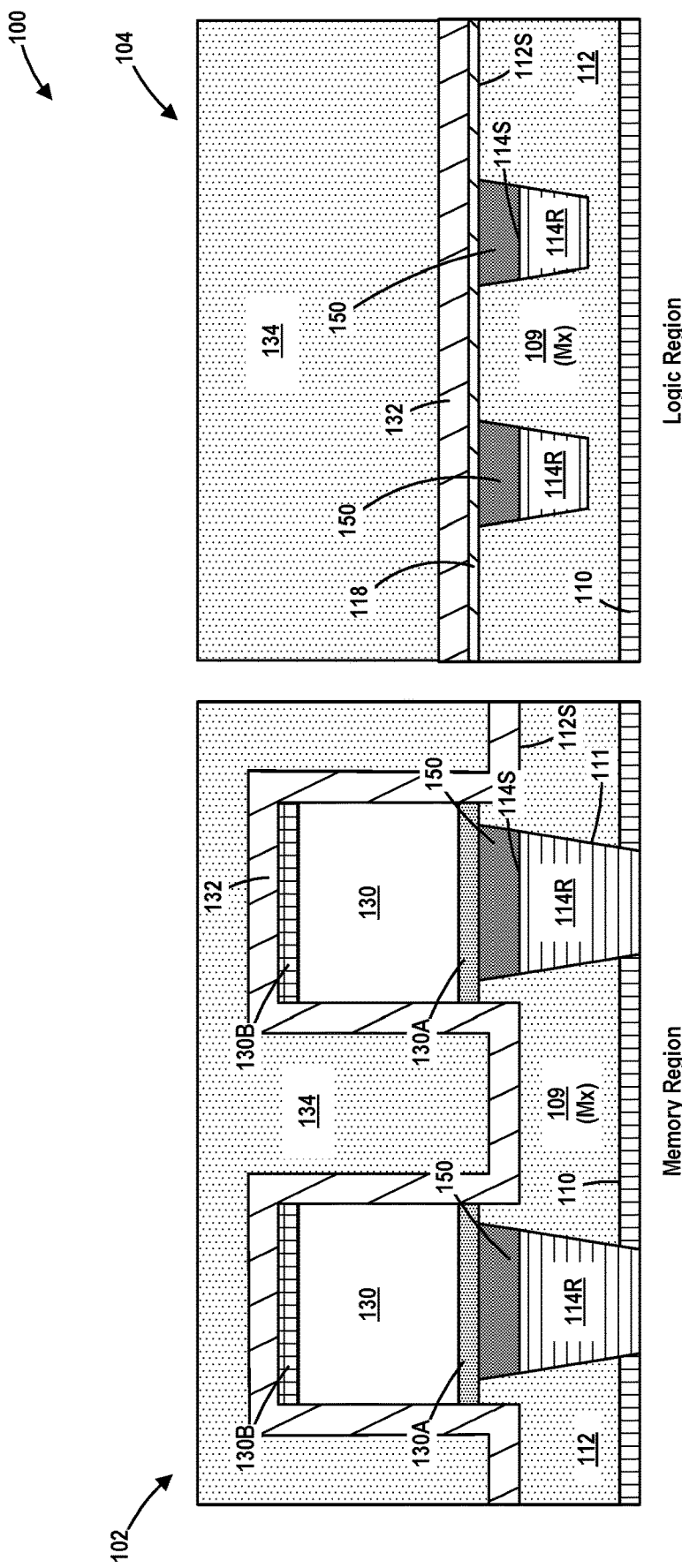

FIG. 20 depicts the product after several process operations were performed. First, the above-described conformal layer of encapsulation material 132 was formed on the product 100. Thereafter, the above-described layer of insulating material 134 was formed above the layer of encapsulation material 132.

Figure 21:
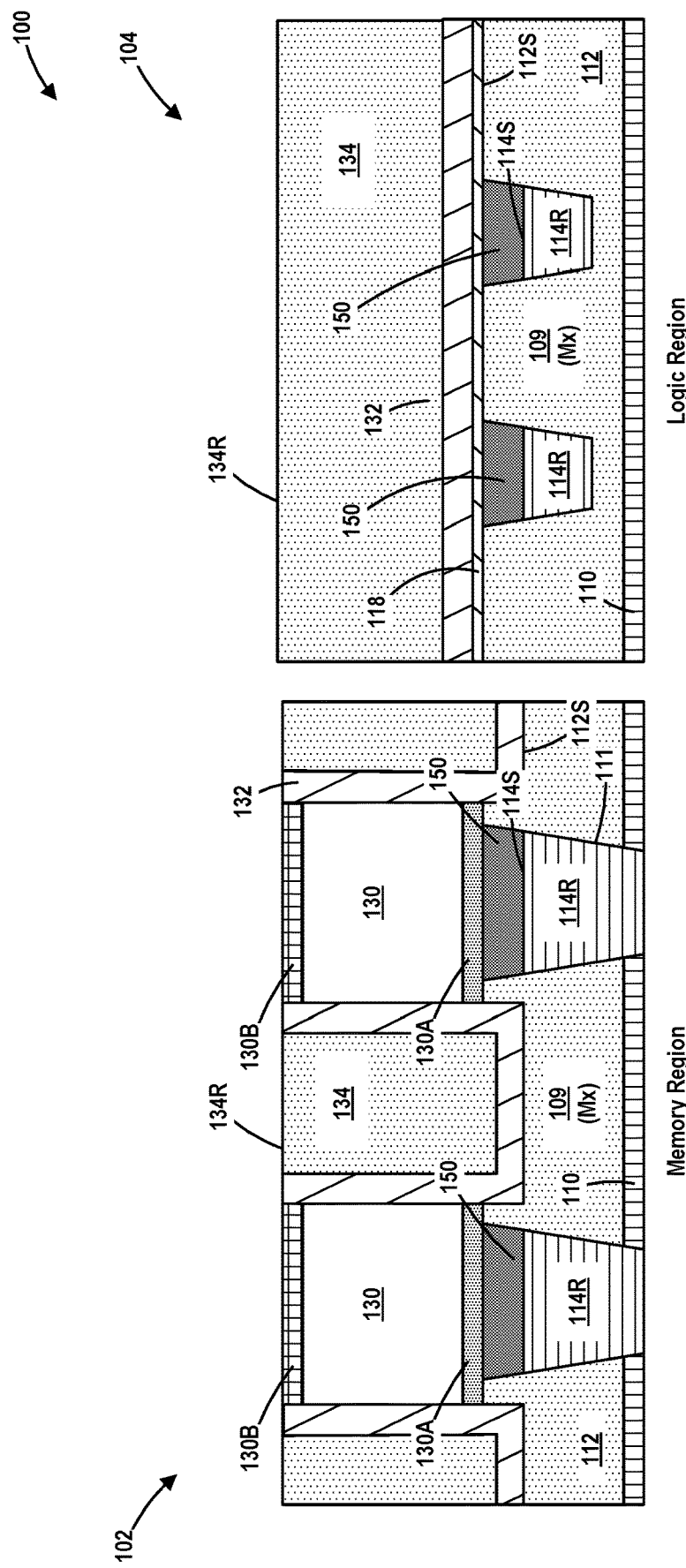

FIG. 21 depicts the product 100 after one or more planarization processes were performed to remove portions of the layer of insulating material 134 (now with a recessed upper surface 134R) and portions of the layer of encapsulation material 132 positioned above the memory cell 130. As before, this process operation exposes the upper conductive material 130B of the memory cells 130.

Figure 22:
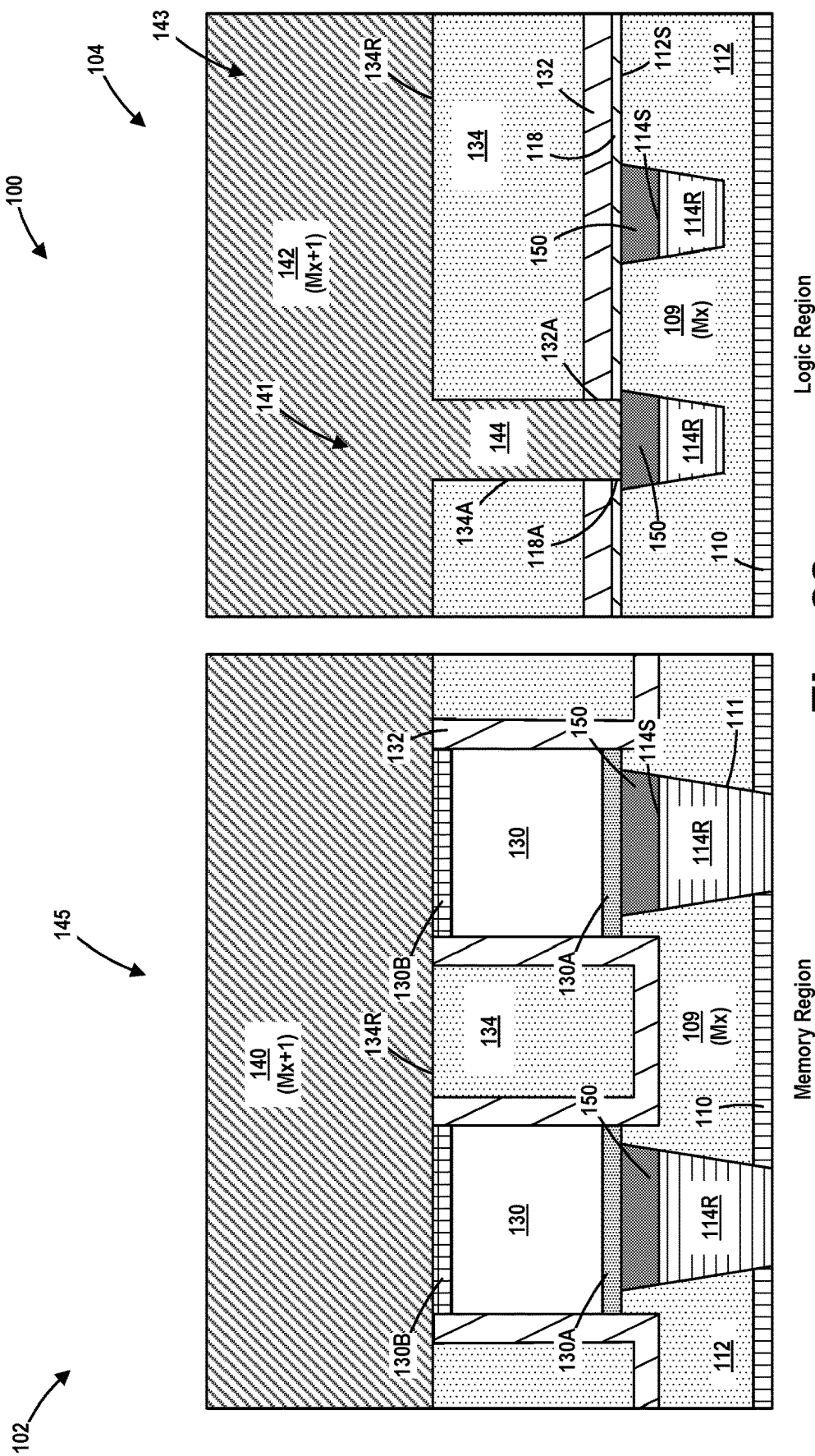

FIG. 22 depicts the IC product 100 after the formation of the above-described etch-stop layer 136, the above-described layer of insulating material 137, the above-described conductive line 140 (in the trench 145), the above-described conductive line 142 (in the trench 143) and the above-described conductive via 144 (in the via opening 141). As depicted, the conductive line 142/conductive via 144 is conductively coupled to the conductive cap layer 150 that is positioned above and conductively coupled to the underlying recessed conductive interconnect structure 114R.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
    a memory region;
    a logic region;
    a layer of insulating material positioned in the memory region and the logic region, the layer of insulating material having an uppermost surface positioned at a first level;
    a first recessed conductive interconnect structure positioned in the memory region;
    a second recessed conductive interconnect structure positioned in the logic region, wherein the first recessed conductive interconnect structure and the second recessed conductive interconnect are positioned at least partially within the layer of insulating material, each of the first and the second recessed conductive interconnect structures comprising an upper surface that is positioned at a second level that is below the first level;
    a first conductive cap layer positioned on the upper surface of the first recessed conductive interconnect structure in the memory region;
    a second conductive cap layer positioned on the upper surface of the second recessed conductive interconnect structure in the logic region; and
    a memory cell positioned above the first conductive cap layer in the memory region, the memory cell comprising a lower conductive material that is conductively coupled to the first conductive cap layer, wherein an upper surface of the first conductive cap layer in the memory region and an upper surface of the second conductive cap layer in the logic region are co-planar with the uppermost surface of the layer of insulating material.

2. The device of claim 1, wherein at least one of the first and the second recessed conductive interconnect structures comprises a first bulk conductive material and at least one of the first and the second conductive cap layers comprises a second bulk conductive material that is different from the first bulk conductive material.

3. The device of claim 1, wherein at least one of the first and the second recessed conductive interconnect structures comprises copper and at least one of the first and the second conductive cap layers comprises tungsten.

4. The device of claim 1, wherein the layer of insulating material comprises one of SiCOH or silicon dioxide and the memory cell comprises one of an MTJ (magnetic tunnel junction) memory device, an RRAM (resistive random access memory) device, a PRAM (phase-change random access memory) device, an MRAM (magnetic random access memory) device, or a FRAM (ferroelectric random access memory) device.

5. The device of claim 1, wherein the lower conductive material is a bottom electrode of the memory cell.

6. The device of claim 1, further comprising at least one of a conductive line and a conductive via.

7. The device of claim 1, wherein a dimension of the lower conductive material of the memory cell in a first direction is greater than a dimension of the upper surface of the first conductive cap layer in the first direction.

8. An integrated circuit product, comprising:
a memory region;
a logic region;
a metallization layer positioned in the memory region and the logic region, the metallization layer comprising a first layer of insulating material having an uppermost surface positioned at a first level;
a plurality of recessed conductive interconnect structures positioned at least partially within the first layer of insulating material, wherein the plurality of recessed conductive interconnect structures include a first recessed conductive interconnect structure positioned in the memory region and a second recessed conductive interconnect structures positioned in the logic region, each of the first recessed conductive interconnect structure and the second recessed conductive interconnect structure comprising an upper surface that is positioned at a second level that is below the first level;
a first conductive cap layer positioned on the upper surface of the first recessed conductive interconnect structure in the memory region, and a second conductive cap layer positioned on the upper surface of the second recessed conductive interconnect structure in the logic region; and
a memory cell positioned above the first conductive cap layer in the memory region, the memory cell comprising a lower conductive material that is conductively coupled to the first conductive cap layer,
a second layer of insulating material positioned on an upper surface of the second conductive cap layer in the logic region, the second layer of insulating material being absent from the memory region.

9. The integrated circuit product of claim 8, wherein the first layer of insulating material comprises one of SiCOH or silicon dioxide, the second layer of insulating material comprises silicon nitride and the memory cell comprises one of an MTJ (magnetic tunnel junction) memory device, an RRAM (resistive random access memory) device, a PRAM (phase-change random access memory) device, an MRAM (magnetic random access memory) device, or a FRAM (ferroelectric random access memory) device.

10. The integrated circuit product of claim 8, wherein the lower conductive material is a bottom electrode of the memory cell.

11. The integrated circuit product of claim 8, wherein at least one of the first and the second recessed conductive interconnect structures comprises a first bulk conductive material and at least one of the first and the second conductive cap layers comprises a second bulk conductive material that is different from the first bulk conductive material.

12. The integrated circuit product of claim 11, wherein at least one of the first and the second recessed conductive interconnect structures comprises copper and at least one of the first and the second conductive cap layers comprises tungsten.

13. The integrated circuit product of claim 8, wherein an upper surface of the first conductive cap layer and the upper surface of the second conductive cap layer are co-planar with an uppermost surface of the first layer of insulating material.

14. The integrated circuit product of claim 8, wherein a dimension of the lower conductive material of the memory cell in a first direction is greater than a dimension of an upper surface of the first conductive cap layer in the first direction.

15. A method of forming an integrated circuit product comprising a memory region and a logic region, the method comprising:
forming a plurality of conductive interconnect structures in a first layer of insulating material, the first layer of insulating material having an uppermost surface positioned at a first level, wherein the plurality of conductive interconnect structures include a first conductive interconnect structure in the memory region and a second conductive interconnect structure in the logic region;
recessing a portion of the first conductive interconnect structure and a portion of the second conductive interconnect structure so as to define a first recessed conductive interconnect structure and a second recessed conductive interconnect structure, respectively, wherein each of the first and the second recessed conductive interconnect structures comprises an upper surface that is positioned at a second level that is below the first level;
forming a first conductive cap layer positioned on the upper surface of the first recessed conductive interconnect structure in the memory region, and a second conductive cap layer positioned on the upper surface of the second recessed conductive interconnect structure in the logic region;
forming a memory cell above the first conductive cap layer in the memory region, the memory cell comprising a lower conductive material that is conductively coupled to the first conductive cap layer; and
forming a second layer of insulating material on an upper surface of the second conductive cap layer in the logic region, the second layer of insulating material being absent from the memory region.

16. The method of claim 15, wherein at least one of the first and the second recessed conductive interconnect structures comprises a first bulk conductive material and at least one of the first and the second conductive cap layers comprises a second bulk conductive material that is different from the first bulk conductive material.

17. The method of claim 15, wherein forming the first and the second conductive cap layers further comprises:
   depositing at least one conductive material so as to overfill a recess located above the upper surface of each of the first and the second recessed conductive interconnect structures and above the at least one first layer of insulating material; and
   recessing portions of the at least one conductive material positioned above the uppermost surface of the first layer of insulating material.

18. The method of claim 17, wherein recessing portions of the first layer of insulating material-comprises performing a chemical mechanical planarization process.

19. The method of claim 15, wherein an upper surface of the first conductive cap layer and the upper surface of the second conductive cap layer are co-planar with the uppermost surface of the first layer of insulating material.

20. The method of claim 15, wherein the first layer of insulating material comprises one of SiCOH or silicon dioxide, the second layer of insulating material comprises silicon nitride, and the memory cell comprises one of an MTJ (magnetic tunnel junction) memory device, an RRAM (resistive random access memory) device, a PRAM (phase-change random access memory) device, an MRAM (magnetic random access memory) device, or a FRAM (ferroelectric random access memory) device.

\* \* \* \* \*